US012671430B2

(12) United States Patent
Reed et al.

(10) Patent No.:  US 12,671,430 B2
(45) Date of Patent:      Jun. 30, 2026

(54) METHOD AND SYSTEM FOR END-TO-END CALIBRATION OF A CHANNEL EMULATOR

(71) Applicant: VIAVI SOLUTIONS LICENSING LLC, Chandler, AZ (US)

(72) Inventors: John Douglas Reed, Arlington, TX (US); Alfonso Rodriguez-Herrera, Denton, TX (US)

(73) Assignee: VIAVI SOLUTIONS INC., Chandler, AZ (US)

( * ) Notice: Subject to any disclaimer, the term of this patent is extended or adjusted under 35 U.S.C. 154(b) by 134 days.

(21) Appl. No.: 18/817,156

(22) Filed: Aug. 27, 2024

(65) Prior Publication Data

US 2026/0066915 A1     Mar. 5, 2026

(51) Int. Cl.
H03M 1/10          (2006.01)
H03M 1/12          (2006.01)
(52) U.S. Cl.
CPC ....... H03M 1/1033 (2013.01); H03M 1/1245 (2013.01)
(58) Field of Classification Search
CPC ........ H03M 1/10; H03M 1/12; H03M 1/1033; H03M 1/1245
See application file for complete search history.

(56) References Cited

U.S. PATENT DOCUMENTS 4,896,155 A  *  1/1990  Craiglow ............ H03M 1/1038
                                                             341/120
5,548,820 A     8/1996  Victorin 6,236,363 B1    5/2001  Robbins et al.
6,349,218 B1    2/2002  Nakagawa et al.
6,414,612 B1 *  7/2002  Quesenberry ....... H03M 1/1028
                                                             341/120
6,571,082 B1    5/2003  Rahman et al.
(Continued)

OTHER PUBLICATIONS

Borsato, et al, "MIMO OTA Channel Validation Part I (Anechoic Chamber)", EDI CON, 2014, 31 pages.

(Continued)

*Primary Examiner* — Lam T Mai
(74) *Attorney, Agent, or Firm* — Mannava & Kang, P.C.

(57)                ABSTRACT

The technology disclosed teaches a system and methods for end-to-end self-calibration of a channel emulator, wherein the channel emulator includes at least one channel emulator signal chain and at least one integrated parallel calibration signal chain. The channel emulator signal chain further includes an input signal, a first signal conditioner, a first analog-to-digital converter, a baseband processor, second signal conditioner, and an output. The integrated parallel calibration signal chain further includes a sequence generator, wherein the sequence generator is configured to generate a pseudo-random sequence upon which a calibration analysis signal is overlayed. On the supplying side, the sequence generator is coupled to a second digital-to-analog converter for supplying the calibration analysis signal to be processed by the channel emulator signal chain. On the evaluating side, the sequence generator is coupled to a comparator for evaluating results of the processed calibration analysis signal.

20 Claims, 13 Drawing Sheets

Channel Emulator Signal Chain with Calibration Signal Chain Schematic 400

(56) References Cited

U.S. PATENT DOCUMENTS

| | | | |
|---|---|---|---|
| 6,822,601 B1* | 11/2004 | Liu | H03M 1/1004 |
| | | | 341/161 |
| 6,952,455 B1 | 10/2005 | Banister | |
| 7,054,296 B1* | 5/2006 | Sorrells | H04B 1/406 |
| | | | 370/480 |
| 7,068,193 B2* | 6/2006 | Dempsey | H03M 1/1028 |
| | | | 341/120 |
| 7,110,435 B1* | 9/2006 | Sorrells | H03D 7/00 |
| | | | 375/147 |
| 7,224,941 B2 | 5/2007 | Liu | |
| 7,324,588 B2 | 1/2008 | Green et al. | |
| 7,395,060 B2 | 7/2008 | Liu | |
| 7,398,056 B1 | 7/2008 | Ebert et al. | |
| 7,508,868 B2 | 3/2009 | Chang | |
| 7,715,844 B2 | 5/2010 | Bi et al. | |
| 8,331,869 B2 | 12/2012 | Foegelle | |
| 8,412,112 B2 | 4/2013 | Foegelle | |
| 8,761,684 B2 | 6/2014 | Reed | |
| 8,787,900 B2 | 7/2014 | Amine et al. | |
| 8,793,093 B2 | 7/2014 | Mow et al. | |
| 8,824,588 B2 | 9/2014 | Emmanuel et al. | |
| 8,880,002 B2 | 11/2014 | Falck et al. | |
| 8,912,963 B2 | 12/2014 | Mow et al. | |
| 8,995,511 B2 | 3/2015 | Reed | |
| 9,024,828 B2 | 5/2015 | Reed | |
| 9,107,098 B2 | 8/2015 | Emmanuel et al. | |
| 9,209,914 B2 | 12/2015 | Reed | |
| 9,246,607 B2 | 1/2016 | Reed et al. | |
| 9,859,907 B1* | 1/2018 | Li | H03M 1/0678 |
| 10,033,473 B1 | 7/2018 | Kyrolainen et al. | |
| 10,244,411 B2 | 3/2019 | Reed | |
| 10,313,034 B2 | 6/2019 | Rodriguez-Herrera et al. | |
| 10,587,350 B2 | 3/2020 | Rodriguez-Herrera et al. | |
| 10,684,318 B1 | 6/2020 | Kyrolainen et al. | |
| 11,451,312 B2 | 9/2022 | Rodriguez-Herrera et al. | |
| 11,503,434 B2* | 11/2022 | Sobol | H04W 4/021 |
| 2003/0016770 A1* | 1/2003 | Trans | H04B 3/32 |
| | | | 375/346 |
| 2003/0050020 A1 | 3/2003 | Erceg et al. | |
| 2003/0112370 A1* | 6/2003 | Long | H04N 7/08 |
| | | | 348/E7.024 |
| 2003/0124982 A1 | 7/2003 | Saari et al. | |
| 2003/0236089 A1 | 12/2003 | Beyme et al. | |
| 2004/0222833 A1* | 11/2004 | Lin | H04B 15/02 |
| | | | 327/162 |
| 2004/0259554 A1 | 12/2004 | Rappaport et al. | |
| 2005/0085223 A1 | 4/2005 | Liu | |
| 2005/0210308 A1 | 9/2005 | Best et al. | |
| 2006/0148429 A1 | 7/2006 | Inogai et al. | |
| 2006/0229018 A1 | 10/2006 | Mlinarsky et al. | |
| 2006/0229020 A1 | 10/2006 | Mlinarsky et al. | |
| 2006/0233111 A1 | 10/2006 | Wright | |
| 2006/0252419 A1 | 11/2006 | Liu | |
| 2007/0019769 A1 | 1/2007 | Green et al. | |
| 2007/0236230 A1 | 10/2007 | Tanbakuchi et al. | |
| 2007/0243826 A1 | 10/2007 | Liu | |
| 2007/0288109 A1* | 12/2007 | Zahornacky | A63H 19/14 |
| | | | 700/94 |
| 2008/0056340 A1 | 3/2008 | Foegelle | |
| 2008/0114580 A1 | 5/2008 | Chin et al. | |
| 2008/0139195 A1 | 6/2008 | Marsyla et al. | |
| 2009/0094492 A1 | 4/2009 | Music et al. | |
| 2010/0079320 A1* | 4/2010 | Wang | H03M 1/1033 |
| | | | 341/120 |
| 2010/0177813 A1 | 7/2010 | Gessner | |
| 2010/0285753 A1 | 11/2010 | Foegelle | |
| 2011/0084887 A1 | 4/2011 | Mow et al. | |
| 2011/0098956 A1* | 4/2011 | Vennelakanti | G01R 35/005 |
| | | | 702/85 |
| 2011/0189962 A1 | 8/2011 | Kyosti et al. | |
| 2011/0191090 A1 | 8/2011 | Kyosti et al. | |
| 2011/0299570 A1 | 12/2011 | Reed | |
| 2012/0098713 A1 | 4/2012 | Mow et al. | |
| 2012/0225624 A1 | 9/2012 | Kyosti et al. | |
| 2012/0275506 A1 | 11/2012 | Ding et al. | |
| 2012/0282863 A1 | 11/2012 | Guo et al. | |
| 2012/0309323 A1 | 12/2012 | Guo et al. | |
| 2013/0027256 A1 | 1/2013 | Guo et al. | |
| 2013/0057436 A1* | 3/2013 | Krasner | G01S 19/45 |
| | | | 342/464 |
| 2013/0210474 A1 | 8/2013 | Kyosti | |
| 2013/0235962 A1 | 9/2013 | O'Keefe et al. | |
| 2014/0126618 A1 | 5/2014 | Kobayashi et al. | |
| 2014/0241408 A1 | 8/2014 | Sozanski et al. | |
| 2015/0017928 A1 | 1/2015 | Griesing et al. | |
| 2015/0118971 A1* | 4/2015 | Zeidan | H04B 17/0087 |
| | | | 455/67.14 |
| 2015/0255868 A1 | 9/2015 | Haddad et al. | |
| 2015/0325913 A1 | 11/2015 | Vagman | |
| 2016/0065230 A1* | 3/2016 | Mulder | H03M 1/34 |
| | | | 341/158 |
| 2016/0212641 A1 | 7/2016 | Kong et al. | |
| 2016/0226709 A1 | 8/2016 | Chen et al. | |
| 2016/0233970 A1 | 8/2016 | Reed | |
| 2016/0352419 A1* | 12/2016 | Fonseka | H04B 7/04 |
| 2017/0222735 A1 | 8/2017 | Kawamura | |
| 2017/0279546 A1 | 9/2017 | McGarry et al. | |
| 2017/0279571 A1* | 9/2017 | Melodia | H04B 11/00 |
| 2018/0034560 A1 | 2/2018 | Foegelle | |
| 2018/0277928 A1 | 9/2018 | Hartenstein | |
| 2018/0337738 A1 | 11/2018 | Wen et al. | |
| 2019/0103665 A1 | 4/2019 | Yoo et al. | |
| 2019/0174466 A1* | 6/2019 | Zhang | H04L 5/0057 |
| 2019/0327694 A1* | 10/2019 | Zur | H04W 52/38 |
| 2020/0008044 A1* | 1/2020 | Poornachandran | H04W 4/024 |
| 2020/0092882 A1* | 3/2020 | Kato | H04W 72/542 |
| 2020/0404069 A1* | 12/2020 | Li | H04L 67/59 |
| 2021/0022143 A1* | 1/2021 | Xiong | H04L 1/0007 |
| 2021/0184795 A1* | 6/2021 | Ibars Casas | H03M 13/6561 |
| 2021/0390004 A1* | 12/2021 | Kundu | H04W 24/08 |

OTHER PUBLICATIONS

Rodriguez-Herrera et al, Spatial Channel Model Validation for 3GPP FR2 MIMO OTA, Mar. 2021, 15th European Conference on Antennas and Propagation (EuCAP), 5 pages.

3rd Generation Partnership Project; Technical Specification Group Radio Access Network; NR; User Equipment (UE) conformance specification; Radio transmission and reception; Part 4: Performance requirements (Release 15), 3GPP TS 38.521-4 V15.1.0 (Jun. 2019).

3rd Generation Partnership Project; Technical Specification Group Radio Access Network; NR; User Equipment (UE) conformance specification; Radio transmission and reception; Part 4: Performance requirements (Release 16), 3GPP TS 38.521-4 V16.7.0 (Mar. 2021).

3rd Generation Partnership Project (3GPP); Technical Specification Group Radio Access Network (RAN); Study on Radiated Metrics and Test Methodology for the Verification of Multi-Antenna Reception Performance of NR User Equipment (UE); (Release 16), 3GPP TR 38.827 V1.4.0 (Jun. 2020). 82 pages.

Jukka-Pekka Nuutinen, et al, "5G MIMO OTA Testing on Frequency Range 2 (FR2)" URSI GASS 2020, Rome, Italy, 29 Aug.-Sep. 5, 2020, 4 pages.

Kyosti, et al, "On Radiated Performance Evaluation of Massive MIMO Devices in Multiprobe Anechoic Chamber OTA Setups", IEEE Transactions On Antennas and Propagation, vol. 66, No. 10, Oct. 2018, 13 pages.

3rd Generation Partnership Project (3GPP), TSG-RAN WG4 Meeting Nr AH2, "Performance Evaluation Metrics for RRM/ Demodulation Measurement Setup", R4-1706668, Keysight, Qingdao, China, Jun. 27-29, 2017, 4 pages.

Meinila et al, D5.3: WINNER+Final Channel Models, Wireless World Initiative New Radio—Celtic Telecommunication Solutions, WINNER+, Version 1.0, Jun. 30, 2010, pp. 1-107.

Macom Technology Data Sheet, MAPS-010165, Digital Phase Shifter 6-Bit, 3.5-6.0 Ghz, V3, Macom Technology Solutions Inc., 8 pages, Jan. 19, 2017.

(56) References Cited

OTHER PUBLICATIONS

Darbari et al., "MIMO Channel Modelling (Miron Signal Processing)", pp. 77-117, University of Strathclyde, Glasgow, ISBN 978-953-7619-91-6, published by InTech, Mar. 1, 2010, www.intechopen.com.

Spirent Vertex Channel Emulator Technical Specifications, Aug. 29, 2017, 2 pages.

Spirent Vertex Channel Emulator Data Sheet, rev. D, Aug. 2017, 4 pages.

"Programmable Phase Shifters", HJ Technologies, 64 × 16-1024, http://www.haojintech.com/index.php/product/index/id/167.html, Oct. 2, 2017, 3 pages.

"Programmable Phase Shifters", HJ Technologies, 16 × 16-256, http://www.haojintech.com/index.php/product/index/id/167.html, Oct. 2, 2017, 3 pages.

Harris et al, "From MIMO to Massive Mimo", University of Bristol (U.K.): Ian Mings British Telecom (BT), Sep. 15, 2017, Microwave Journal, http://www.microwavejournal.com/articles/print/28974-from-mimo-to-massive-mimo, 10 pages.

"Introduction to Network Analyzer Measurements", www.ni.com/rf-academy, National Instruments, Mar. 5, 2014, pp. 1-44.

"5G Spectrum Public Policy Position", Nov. 2016, GSMA, London EC4n 8AF UK, www.gsma.com, pp. 1-7.

"MIMO Beamforming Test System", https://www.spirent.com/Products/MIMO_Beamforming_Test_System, Oct. 10, 2017, pp. 1-4.

Larsson et al, "Massive MIMO for Next Generation Wireless Systems", IEEE Communications Magazine, vol. 52, issue 2, Jan. 21, 2014, pp. 1-20.

Hoydis et al, "Massive MIMO in the UL/DL of Cellular Networks: How Many Antennas Do We Need?", IEEE Journal on Selected Areas in Communications, Institute of Electrical and Electronics Engineers, 2013, 31 (2), Jan. 8, 2014, pp. 160-171.

Bjornson et al, "Massive MIMO Systems with Hardware-Constrained Base Stations", Access Centre, Dept. of Signal Processing, KTH Royal Institute of Technology, Stockholm, Sweden, Mar. 19, 2014, pp. 1-5.

Rusek et al, "Scaling Up MIMO: Opportunities and Challenges with Very Large Arrays", INFONET, GIST Journal Club, Mar. 21, 2013, IEEE Signal Processing Magazine, pp. 1-12.

Li et al, "Dynamic Beamforming for Three-Dimensional MIMO Technique in LTE-Advanced Networks", Wireless Signal Processing and Network Lab, Key Lab of Universal Wireless Communications (Ministry of Education), Beijing University of Posts and Telecommunications, Hindawi Publishing Corp., Intl. Journal of Antennas and Propagation, vol. 2013, Article ID 764507, http://dx.doi.org/10.1155/2013/764507, Jul. 4, 2013, pp. 1-9.

Raschkowski et al, "METIS Channel Models", d1.4", https://www.metis2020.com/wp-content/uploads/METIS_D1.4_v3_pdf.2015, Mobile and wireless communications Enablers for the Twenty-twenty information Society (METIS), Jul. 14, 2015, 223 pages.

Molisch et al, "Hybrid Beamforming for Massive MIMO—A Survey", IEEE Comm. Mag., vol. 55, iss. 9, 2017, Apr. 30, 2017, pp. 1-13.

Rumney, "LTE and the Evolution to 4G Wireless: Design and Measurement Challenges," Agilent Technologies Publication, Chapter 6: "Design and Verification Challenges", 2009, pp. 199-411.

"Move Forward to What's Possible in LTE," Agilent Technologies, Inc., Mar. 16, 2009, pp. 1-12, accessed at http://www.agilent.com/find/lte.

"Agilent 3GPP Long Term Evolution: System Overview, Product Development, and Test Challenges," Application Note, Agilent Technologies, Inc., Sep. 8, 2009, pp. 1-92, accessed at http://www.agilent.com/find/LTE.

"E6620 Wireless Communications Test Set," Agilent Technologies, Inc., Jun. 8, 2009, pp. 1-12, accessed at http://www.agilent.com/find/8960devicedesign.

Technical White Paper, "Long Term Evolution (LTE): A Technical Overview," Motorola, Inc., 2007, pp. 1-15, accessed at www.motorola.com.

Narandzic, et al., "Comparison of SCM, SCME, and WINNER Channel Models," IEEE, 2007, pp. 413-417.

Berger, Lars T., et al., "Geometry Based Other-Sector Interference Modelling for Downlink Systme Simulations", 2004, 5 pages.

Baum, Daniel S., et al., "An Interim Channel Model for Beyond-3G Systems", 2005, 5 pages.

Cita, "Test Plan for 2x2 Downlink MIMO and Transmit Diversity Over-the-Air Performance", Aug. 2015, 75 pages.

Huang et al., "Spatial Interference Cancellation for Multi-Antenna Mobile Ad Hoc Networks", Jul. 11, 2008, 28 pages.

Reed, "MIMO OTA Antenna Measurements", CTIA Panel Session, Mar. 2011, Orlando.

"Fundamentals of Wireless Channel Emulation", Dec. 2012, octoScope, 225 Cedar Hill Street, Ste. 200, Marlborough, MA 01752 USA, www.octoScope.com, 58 pages.

Reed, "MIMO OTA Test Methods", CTIA Panel Session, May 2012, 32 pages, New Orleans, LA.

"3GPP on track to 5G", http://www.3gpp.org/news-events/3gpp-news/1787-ontrack_5g, Jun. 27, 2017, pp. 1-2.

PCT/US2010/024204—International Preliminary Report on Patentability dated Aug. 16, 2011, 5 pages.

U.S. Appl. No. 17/364,703, filed Jun. 30, 2021, U.S. Pat. No. 11,451,312, Sep. 20, 2022.

U.S. Appl. No. 15/782,769, filed Oct. 12, 2017, U.S. Pat. No. 10,313,034, Jun. 4, 2019.

U.S. Appl. No. 16/430,239, filed Jun. 3, 2019, U.S. Pat. No. 10,587,350, Mar. 10, 2020.

U.S. Appl. No. 14/177,165, filed Feb. 10, 2014, U.S. Pat. No. 9,246,607, Jan. 26, 2016.

* cited by examiner

Exemplary Channel Emulator Schematic 100A

Channel Emulator Signal Chain Schematic 200A

Channel Emulator Signal Chain with Direct RF Sampling Schematic 200B

Sequences with Perfect Autocorrelation and Cross-Correlation Properties 300B

Maximum Length Sequence
308

$$N = 2^k - 1$$

Gold Sequence
328

| Maximum Length Sequence $f$ 338 $N = 2^k - 1$ | Maximum Length Sequence $g$ 339 $N = 2^k - 1$ |

Cross-Correlation of $f$ and $g$
348

$$R(f, g) \leq 2^{(k+2)/2}$$

Zadoff-Chu sequence
368

$$x_u(n) = \exp\left(-j\ \frac{\pi u n (n + c_f + 2q)}{N_{ZC}}\right)$$

where $N_{ZC}$ = length, $0 \leq n \leq N_{ZC}$, $\gcd(N_{ZC}, u) = 1$, $c_f = N_{ZC} \bmod 2$

Pseudo-Random Binary Sequence
306

$$a_j \in \{0, 1\} \text{ for } j = 0, 1, \ldots, N - 1$$

Autocorrelation
326

$$C(v) = \sum_{j=0}^{N-1} a_j a_{j+v}$$

$$C(v) = \begin{cases} m, & \text{if } v \equiv 0 \ (\bmod\, N) \\ mc, & \text{otherwise} \end{cases}$$

$$\text{where } c = \frac{m - 1}{N - 1}$$

Constant Amplitude Zero Auto-Correlation (CAZAC) sequence
346

For a CAZAC sequence of length $N$ where $M$ is relatively prime to $N$ the $k^{th}$ symbol $u_k$ is given by:

$$u_k = \exp\left(j\ \frac{M\pi k^2}{N}\right) \qquad u_k = \exp\left(j\ \frac{M\pi k(k+1)}{N}\right)$$

when $N$ is even                        when $N$ is odd

Figure 3B

Channel Emulator with Multiple Parallel Signal Chains 500

Two-Tone Testing for Intermodulation Distortion 700

METHOD AND SYSTEM FOR END-TO-END CALIBRATION OF A CHANNEL EMULATOR

RELATED APPLICATIONS

This application is related to commonly owned U.S. Pat. No. 11,451,312 titled "Mobile-Assisted Phase Calibration Method and System," filed 30 Jun. 2021, which claims the benefit of U.S. Provisional Patent Application No. 63/047,894 entitled "Mobile-Assisted Phase Calibration Method and System," filed on 2 Jul. 2020. This application also is related to commonly owned U.S. Pat. No. 10,597,305 titled "Calibrating a Programmable Phase Matrix and Channel Emulator and Performing Massive MIMO Array Testing Using the Calibrated Phase Matrix and Channel Emulator," filed 3 Jun. 2019, which is a continuation-in-part of U.S. Pat. No. 10,313,034 titled "Massive MIMO Array Testing Using a Programmable Phase Matrix and Channel Emulator," filed 12 Oct. 2017. This application also is related to commonly owned U.S. Pat. No. 9,246,607 titled "Automatic Phase Calibration," filed 10 Feb. 2014. The related applications are all incorporated by reference herein for all purposes.

FIELD OF THE TECHNOLOGY DISCLOSED

The technology disclosed relates generally to end-to-end self-calibration in phase, amplitude, delay, and flatness for a channel emulator (CE).

U.S. Pat. No. 9,246,607 "Automatic Phase Calibration", also by inventors John Douglas Reed and Alfonso Rodriguez-Herrera, describes relevant prior art, and includes descriptions of calculations for phase calibration in a MIMO RF test platform environment.

BACKGROUND

The subject matter discussed in this section should not be assumed to be prior art merely as a result of its mention in this section. Similarly, a problem mentioned in this section or associated with the subject matter provided as background should not be assumed to have been previously recognized in the prior art. The subject matter in this section merely represents different approaches, which in and of themselves may also correspond to implementations of the claimed technology.

In a test platform for testing radio communications in an RF environment, a radio channel can be emulated in a channel emulator (CE). In a typical use case for a CE, input RF signals are unfaded waveforms that correspond to a given air interface, such as 4G, 5G, WiFi, or another over the air interface RF waveform. The unfaded inputs can be passed to the channel emulator so propagation impairments like Doppler spread, multipath, correlation, and noise can be added. Analog blocks within the CE chain can often add unintentional effects, like variable delay, variable group delay (i.e., manifested by non-flat frequency response), variable gain, and variable phase, and additional effects dependent on temperature, humidity, and other physical parameters. This variability can be non-linear in nature, making distortion mitigation techniques more difficult. Consequently, it is important to keep the phase, amplitude, delay, and flatness parameter value ranges controlled for the set-up and maintenance of a test platform. As a result of system aging and exposure to environmental conditions (e.g., temperature, humidity, dust, etc.), periodic factory calibrations are used to mitigate variability in phase, amplitude, delay, and flatness characteristics. Many RF test instruments undergo calibration every year, for example.

Calibration is traditionally performed with external signal analyzer equipment. In a modern CE, there can be tens or even hundreds of signal chains. It so tedious to keep and all of these signal chains aligned in delay, phase, amplitude, and flatness that recalibration is the exception, rather than a common practice. In a multiple-input, multiple-output (MIMO) RF environment with M inputs and N outputs, there are M×N radio links. The time- and cost-intensiveness of using external signal analyzers to calibrate a CE grow exponentially as the size of a MIMO RF environment increases.

An opportunity arises to introduce end-to-end self-calibration of phase, amplitude, delay, and flatness parameters for a CE.

BRIEF DESCRIPTION OF THE DRAWINGS

In the drawings, like reference characters generally refer to like parts throughout the different views. Also, the drawings are not necessarily to scale, with an emphasis instead generally being placed upon illustrating the principles of the technology disclosed. In the following description, various implementations of the technology disclosed are described with reference to the following drawings.

FIG. 3B shows a plurality of sequences having perfect autocorrelation and cross-correlation properties such that each respective class of sequence resembles noise, a useful property for CE calibration.

DETAILED DESCRIPTION

Figure 1A:
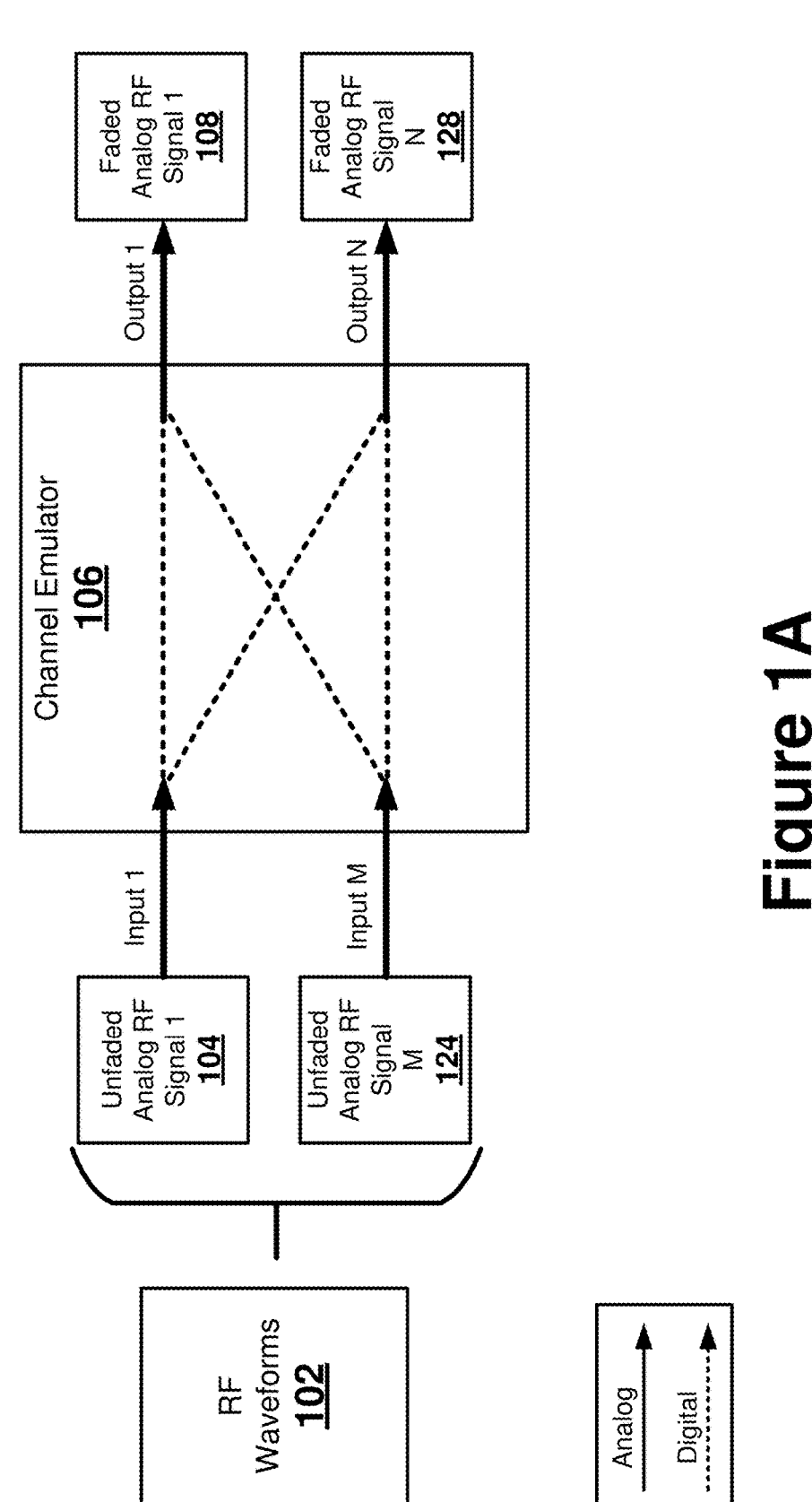
FIG. 1A shows a schematic diagram of an exemplary channel emulator signal chain.

The following detailed description is made with reference to the figures. Sample implementations are described to illustrate the technology disclosed, not to limit its scope, which is defined by the claims. Those of ordinary skill in the art will recognize a variety of equivalent variations on the description that follows.

Real world characteristics of a radio channel are emulated in a test platform for testing radio RF communications by a channel emulator (CE). In a typical use case for a CE, input RF signals are unfaded waveforms that correspond to a given air interface, such as 4G, 5G, WiFi, or another over the air interface RF waveform. The unfaded inputs can be passed to the channel emulator so propagation impairments like Doppler spread, multipath, correlation, and noise can be added. A simple CE signal chain can include, for example, one or more input signals (e.g., N unfaded analog RF signals), an analog-to-digital converter (ADC), a baseband processing unit, and a digital-to-analog converter (DAC), and one or more output signals (e.g., M faded analog RF signals). The CE signal chain may further include signal conditioners located before the ADC and/or after the DAC, adding effects such as attenuation, phase shift, insertion delay, and/or flatness. In some implementations, the CE signal chain further includes a Down Converter located before the ADC and an Up Converter located after the DAC. In modern architectures, traditional radio structures based on frequency conversion (e.g., heterodyne, superheterodyne, or homodyne) are no longer needed as modern ADCs and DACs are clocked at faster and faster rates thanks to advancements in technology. Accordingly, many implementations rely on direct RF sampling. For example, a single chip can directly sample RF spectra below 6 GHz and perform all signal processing in the digital domain. In a direct RF sampling implementation, frequency conversion blocks (i.e., Down Conversion and Up Conversion) can be substituted by mere signal conditioning blocks (e.g., impedance matching, attenuation, amplification, filtering, etc.).

Analog blocks within the CE chain can often add unintentional effects, like variable delay, variable group delay (i.e., manifested by non-flat frequency response), variable gain, and variable phase, and additional effects dependent on temperature, humidity, and other physical parameters. This variability can be non-linear in nature, making distortion mitigation techniques more difficult. Consequently, it is important to keep the phase, amplitude, delay, and flatness parameter value ranges controlled for the set-up and maintenance of a test platform. As a result of system aging and exposure to environmental conditions (e.g., temperature, humidity, dust, etc.), periodic factory calibrations are used to mitigate variability in phase, amplitude, delay, and flatness characteristics. Many RF test instruments undergo calibration every year, for example.

Calibration is traditionally performed with external signal analyzer equipment. In a modern CE, there can be tens or even hundreds of signal chains to keep aligned in delay, phase, amplitude, and flatness when in use. In a multiple-input, multiple-output (MIMO) RF environment with M inputs and N outputs, there are M×N radio links. The time- and cost-intensiveness of using external signal analyzers to calibrate a CE grow exponentially as the size of a MIMO RF environment increases.

The technology disclosed offers a solution to the problem of calibration for a CE signal chain that can replaces expensive external signal analyzers with low-cost hardware and an end-to-end self-calibration technique. This self-calibration involves addition of a secondary calibration signal chain to the CE signal chain. The secondary calibration signal chain can include, for example, a sequence generator configured to create a signal to be converted to analog and coupled into the input port of the CE. The newly inserted signal is thus added to the input port, both signals traversing the original CE signal chain. The level of the inserted signal may be set to a predetermined level, or adjusted based on the signal-to-noise ratio (SNR) at the output. The internally created signal has a known, time varying frequency pattern, and thus, can be received at the output, converted back to digital, and compared to the original input signal (e.g., using processing means such as a correlation detector). Comparison, performed by a comparator component, can include extracting the difference in delay, phase, amplitude, and flatness parameters and pass the extracted data as corrections to the baseband processing unit. The baseband processing unit is then able to act upon the received corrections to maintain the delay, phase, amplitude, and flatness of the original signal chain to predefined target values.

The end-to-end self-calibration technology disclosed is characterized by a novel design of the calibration signal created by the sequence generator combined with a novel approach for removing the calibration signal from the output. Notably, the original input signal and the calibration signal can coexist at the same time, which is advantageous in a test environment. As discussed above, once the sequence generator has created a signal that is converted to analog and coupled to the input port, the newly created signal is added to the input signal such that both signals traverse the original CE signal chain. The internally created signal has a known pattern, and can consequently be received at the output, converted back to digital, and compared to the original signal. Furthermore, the technology disclosed enables real-time measurement of impairments generated by the CE and adjustment to achieve parameter values for phase, amplitude, delay, band flatness, and a match target channel characteristic selected for emulation (including channel impairments such as multi-path delays, relative delay powers, phase offsets relating to beam forming, gain balance between ports, delays associated with modeling array elements, or distances between antenna elements). The technology disclosed leverages sequences with perfect autocorrelation and cross-correlation properties to assist in removal of the calibration signal from the output.

While the sequence generator can create any signal, many implementations include the sequence generator creating a maximum length (MaxL) sequence. MaxL sequences possess perfect or near-perfect autocorrelation and cross correlation properties, and as a result, the sequences resemble noise. MaxL sequences, also referred to as "pseudo-noise," are deterministically generated, can be easily created in digital logic, and can be perfectly recreated over and over again. Moreover, MaxL sequences are advantageous because their spectrum is wideband and flat (i.e., their autocorrelation approaches the impulse function) and as a result, it is easier to compare the MaxL sequence to an ideal flat spectrum. MaxL sequences are also used for spread spectrum communications. This spreading-dispreading capability means that the signal level can be made very small and take advantage of the processing gain. Thus, the calibration sequence could be operated at, near, or below the desired signal noise floor making it potentially undetectable. For example, a single bit per second can be spread using $2^{28}$ chips, providing a processing gain of $10*\log 10(2^{28})=$ 84.28 dB. When the calibration signal is made coherent with the input signal passed through the CE signal chain, the calibration signal can easily be canceled to minimize the interference of the calibration signal with the input signal. Other implementations include the sequence generator creating different sequences with perfect autocorrelation and cross correlation properties, such as Gold sequences, Generalized Chirp-Like (GCL) sequences, and Zadoff-Chu sequences.

The discussion is organized as follows. First, a reference table is provided listing acronyms used herein for the convenience of the reader. Next, the architecture of an exemplary channel emulator signal chain is described with reference to FIGS. 1A-2B. The concepts of cross correlation and autocorrelation are introduced (FIGS. 3A-3B), as well as various sequences possessing perfect cross correlation and autocorrelation properties and their utility for CE calibration purposes (FIG. 3C). The sequences described with reference to FIG. 3C are created by a sequence generator in many implementations of the technology disclosed, which is described in the context of a CE calibration signal chain with reference to FIG. 4 and various other particular implementations shown in FIGS. 5, 6A, and 6B.

In the description of some implementations, example techniques for validating the CE model are discussed. Concepts and calculations related to validation, such as measuring the EVM of the signal chain or intermodulation products, are described (see, e.g., FIGS. 7-9). Many additional implementations of the technology disclosed are discussed; however, it is to be understood that other existing implementations fall within the spirit and scope of the technology disclosed and will be apparent to a user skilled in the art.

Acronyms

Acronyms used in this disclosure are identified the first time that they are used. These acronyms are terms of art, often used in standards documents. Except where the terms are used in a clear and distinctly different sense than they are used in the art, we adopt the meanings found in testing standards. For the reader's convenience, some of them are listed next.

ADC Analog-to-Digital Converter
AWGN Additive White Gaussian Noise
CE Channel Emulator
DAC Digital-to-Analog Converter
EVM Error Vector Magnitude
GCL Generalized Chirp-Like
KPI Key Performance Indicator
ML Maximum Length
MIMO Multiple Input Multiple Output
MMSE Minimum Mean Squared Error
NE Network Emulator
RSRP Reference Signal Received Power
RSSI Received Signal Strength Indicator
SNR Signal to Noise Ratio
UE User Equipment
VNA Vector Network Analyzer
An exemplary CE signal chain will now be introduced.

Channel Emulator Overview

FIG. 1A shows a schematic diagram of an exemplary channel emulator (CE) signal chain 100A, before incorporation of the technology disclosed. CE signal chain 100A is an M×N MIMO environment, beginning with a total of M analog RF waveforms 102, including a first unfaded analog RF signal 104 up to an $M^{th}$ unfaded analog RF signal 124. The input RF waveforms 102 are passed through the CE 106, generating a total of N outputs including a first faded analog RF signal 108 and an $N^{th}$ faded RF signal 128. More specifically, the input waveforms 102 are unfaded analog waveforms that correspond to a given air interface (e.g., 4G, 5G, WiFi, etc.). As the input waveforms 102 are passed through CE 106, the analog signals are converted into a digital signal by an analog-to-digital converter (ADC) and propagation impairments can be added to the signals, such as Doppler spread, multipath, correlation, and noise. The digital signals are converted back into an analog signal by a digital-to-analog converter (DAC), resulting in the final output of faded analog RF signals 124. The CE signal chain 100A may further include peripheral blocks connected to the CE such as cables, amplifiers, and so on (omitted from FIG. 1A for clarity and conciseness).

Figure 1B:
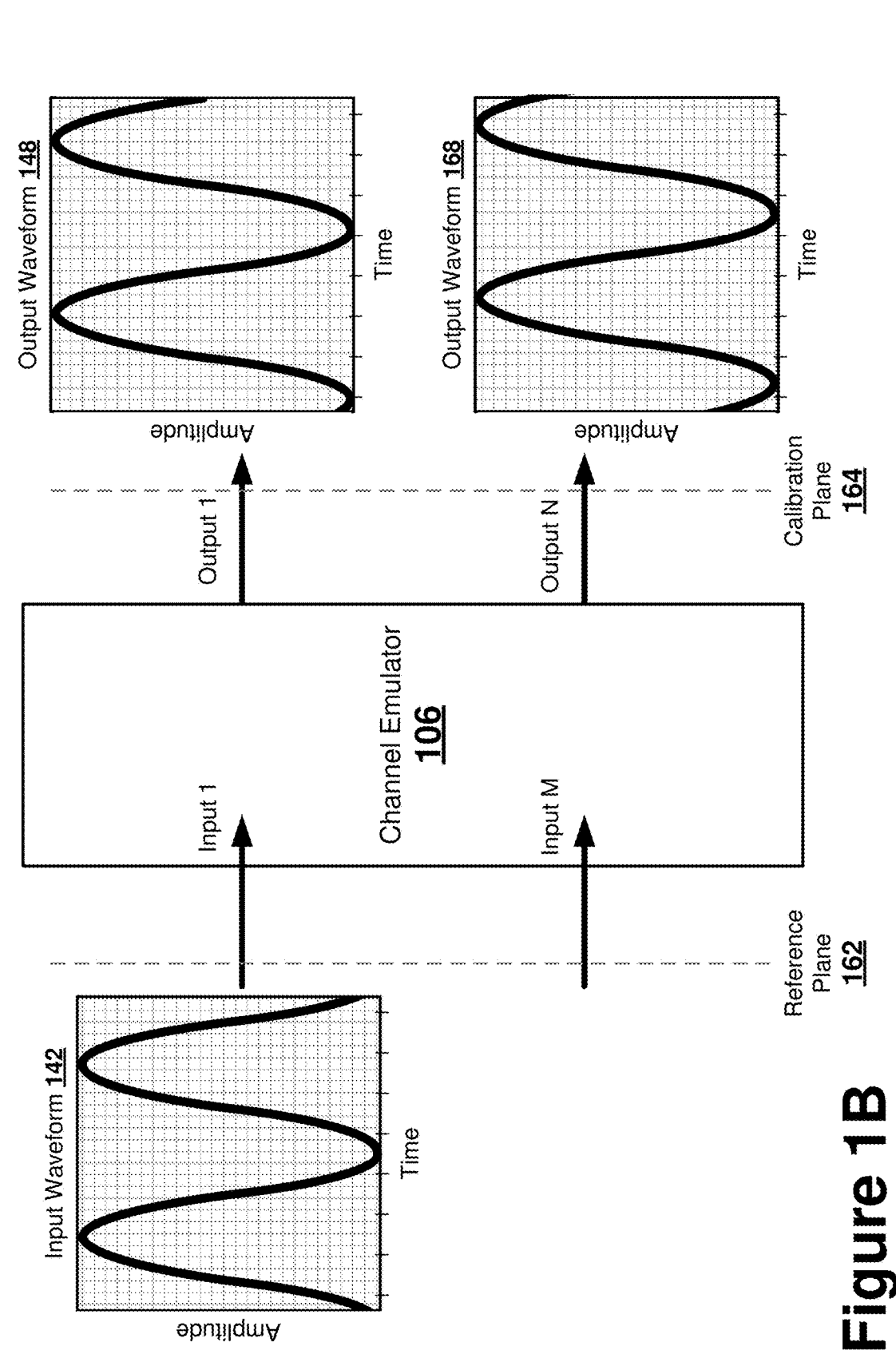
FIG. 1B depicts a complex sinusoid input passing through a CE via two different paths, resulting in two different outputs respectively shifted in phase by a random amount.
Figure 1C:
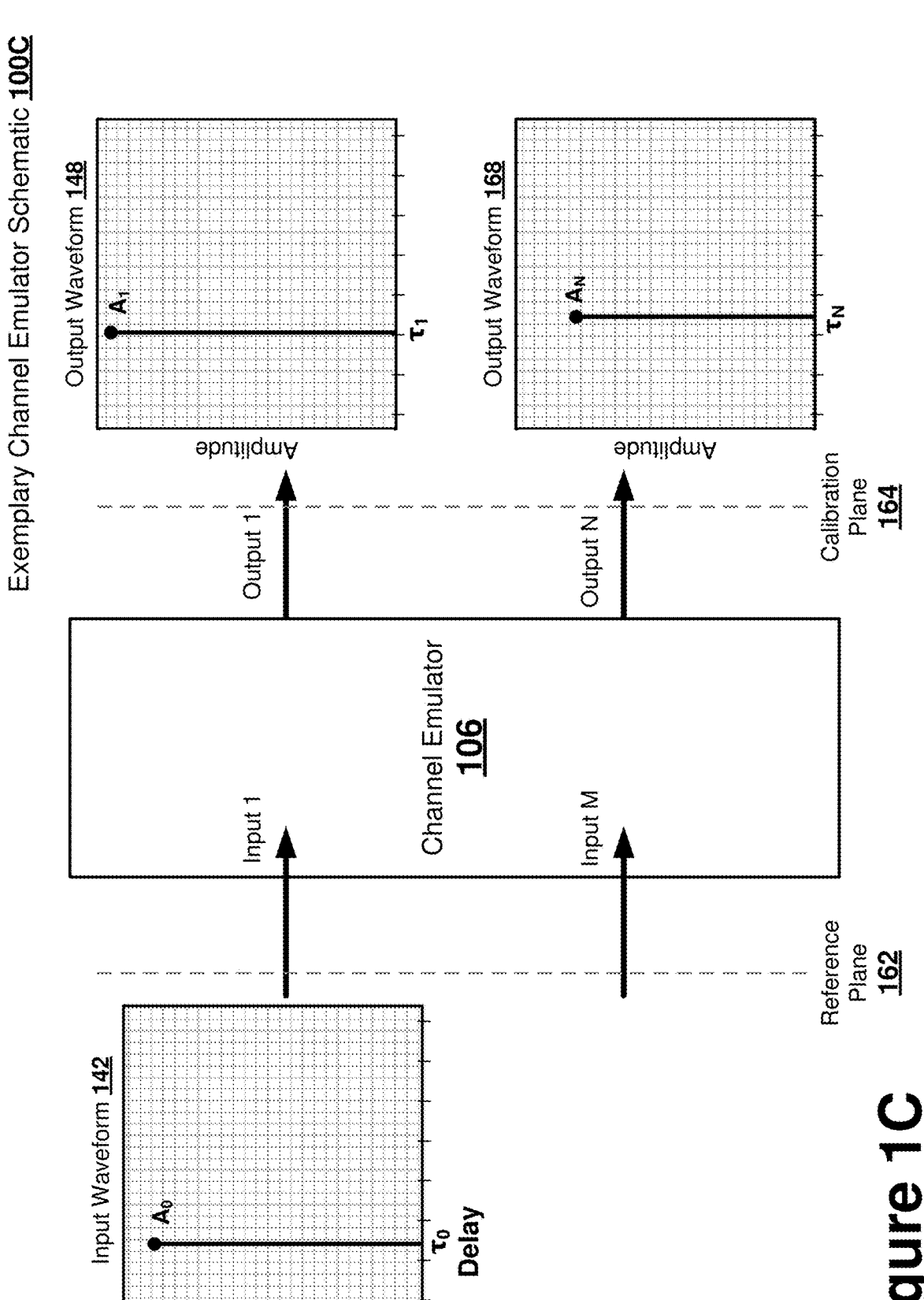
FIG. 1C depicts a complex sinusoid input passing through a CE via two different paths, resulting in two different outputs respectively delayed by a random amount and each having a different amplitude.

Analog blocks within the CE chain 100A can add unintentional effects, like variable delay, variable group delay, variable gain, and variable phase, and additional effects dependent on temperature, humidity, and other physical parameters. This variability can be non-linear in nature, making distortion mitigation techniques more difficult. Consequently, it is important to keep the phase, amplitude, delay, and flatness parameter value ranges controlled for the set-up and maintenance of a test platform. The disclosed systems and methods relate to an end-to-end calibration in phase, amplitude, delay, and flatness for a CE 106, discussed in further detail with reference to FIGS. 1B and 1C. FIG. 1B presents the need for phase calibration to correct phase variability, and FIG. 1C presents the need for amplitude and delay calibration.

FIG. 1B depicts a complex sinusoid input 142 passing through a CE 106 via two different paths, resulting in two different outputs respectively shifted in phase by some amount, intended or not. The waveforms in schematic 100B are depicted as a function of time represented on a graph with time on the x-axis and amplitude on the y-axis. On the input side of CE (i.e., in the reference plane 162) there is a complex sinusoid 142 that is passed through the CE 106 via two different paths into the calibration plane 164. The two different output signals 148, 168 are shifted in phase by some amount, i.e., the magnitude of the output waveforms 148, 168 on the y-axis has not changed in schematic 100B, but output waveforms 148, 168 have both shifted in phase (presented on the x-axis in schematic 100B) such that the phase of the original input waveform 142, output waveform 148, and output waveform 168 do not align with one another.

When a phase calibration is performed using a calibration signal, the test output signals will be aligned to have the same phase shift. FIG. 1C depicts a complex sinusoid input 142 passing through a CE 106 via two different paths, resulting in two different outputs 148, 168 respectively delayed by a random amount and each having a different amplitude. Similar to FIG. 1B, FIG. 1C also includes a complex sinusoid input 142 that is passed through the CE 106 via two different paths in the calibration plane 162. The waveforms in schematic 100C are depicted as a function of time represented on a graph with time on the x-axis and amplitude on the y-axis. Phase is omitted from schematic 100C to clearly show amplitude and time. In addition to the phase variability depicted in FIG. 1B, FIG. 1C further illustrates how the two resulting outputs 148, 168 can be delayed by some unintended amount (i.e., time point $\tau_0$ of input 142, time point $\tau_1$ of output 148, and time point $\tau_N$ of output 168 are not aligned with one another). Outputs 148, 168 further differ in amplitude by some amount (i.e., $A_0$ of input 142, $A_1$ of output 148, and $A_M$ of output 168 are not aligned with one another). After amplitude and delay calibration, the test output signals will have the same delay and amplitude.

Figure 2A:
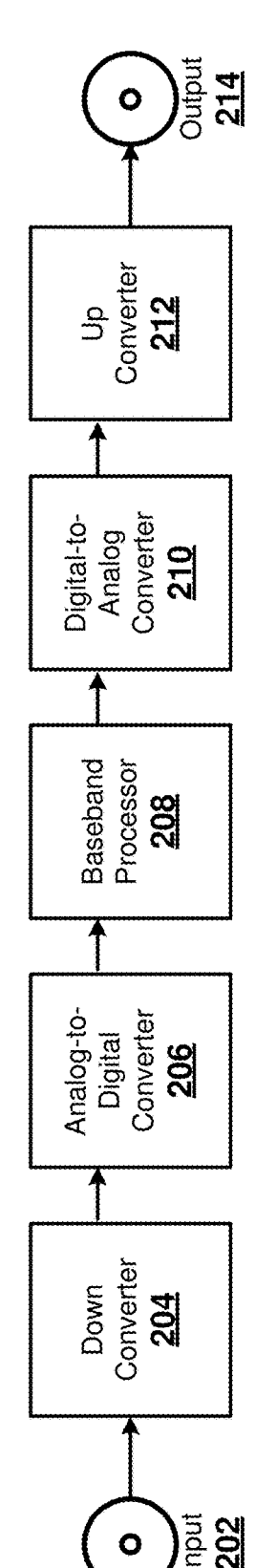
FIG. 2A shows a schematic diagram of a CE signal chain including Down and Up Converters.
Figure 2B:
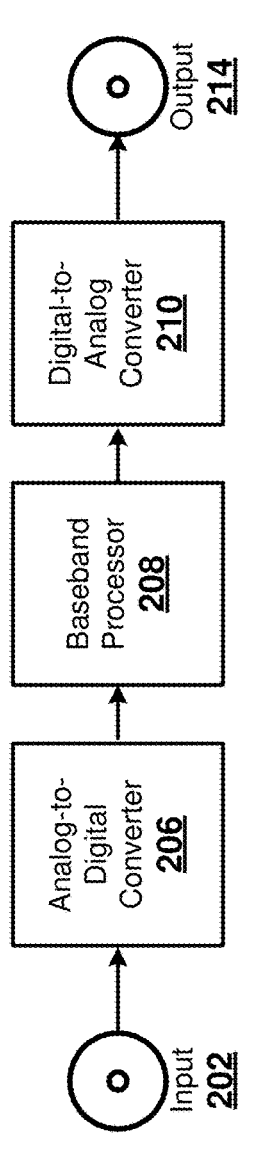
FIG. 2B shows a schematic diagram of a CE signal chain including direct RF sampling.
Figure 3A:
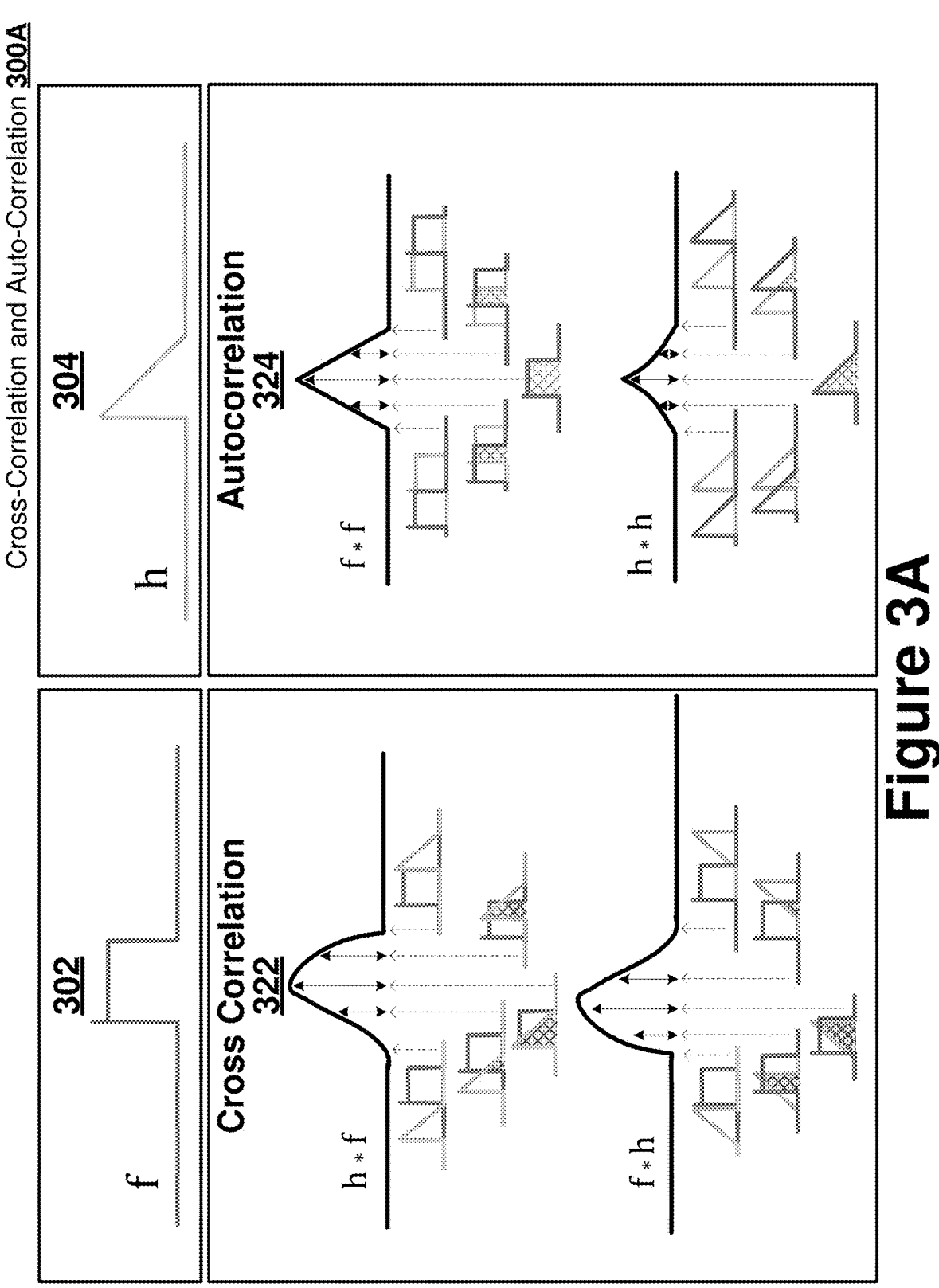
FIG. 3A illustrates a simplified comparison of the cross correlation and autocorrelation of two respective signals.

Next, the system components of a CE signal chain are illustrated in FIGS. 2A and 2B prior to introducing a calibration signal chain of the disclosed end-to-end CE calibration system.

FIG. 2A shows a schematic diagram of a CE signal chain 200A including Down and Up Converters 204, 212. CE signal chain 200A begins with an input analog signal 202, analogous to input waveforms 102, 142, that undergoes down conversion, via down converter 204, in addition to conversion into the digital plane by ADC 206. Down conversion is performed to convert the band-limited input signal to a lower frequency signal at a lower sampling rate to simplify the subsequent radio stages. Often, the input signal 202 begins as a raw RF signal that, after passing through blocks 204, 206 for digitizing and down conversion, results in a complex baseband signal. Baseband refers to the range of frequencies occupied by a signal that has not been modulated to higher frequencies. In RF applications, the baseband signal can be used to modulate RF carrier signals of a much higher frequency. The baseband processor 208 is configured to process a down-converted digital signal to retrieve data. After passing through the baseband processor 208 in CE signal chain 200A, the signal is converted back into an analog format by DAC 210 and up-converted by up converter 212 and converted to a higher frequency signal, resulting in a faded output signal 214 that is analogous to output signals 108, 128, 148, 168. As the signal passes through the CE signal chain 200A, unintentional effects are added like variable delay, variable group delay, variable gain, and variable phase. The variability can be non-linear in nature, making distortion mitigation techniques more difficult. Hence, CE calibration techniques are used to correct distorted parameters including phase, amplitude, delay, and flatness.

FIG. 2B shows a schematic diagram of a CE signal chain 200B including direct RF sampling. In contrast to CE signal chain 200A, CE signal chain 200B implements direct RF sampling such that up- and down-conversion of the signal is no longer needed, and the resultant signal chain is greatly simplified. As described above with reference to CE signal chain 200A, a "traditional" signal chain (e.g., heterodyne, superheterodyne, or homodyne radio structures) includes an input RF frequency that undergoes down conversion to a lower intermediate frequency that is then digitized prior to digital filtering and demodulation.

Several impairments come from the conversion, including IQ imbalance that must be compensated for in either the time or frequency domain. Prior to recent technological advancements, direct sampling without down conversion was not practical because of limitations to converter sampler rates and resolution. Recent semiconductor technologies have achieved expanded resolution at higher sampling frequencies. The availability of higher-speed ADCs with increased resolution has enabled direct sampling of RF signals at their operating frequency, negating the need for down conversion (and hence, also negating the need for up-conversion as well). Direct RF sampling reduces the number of conversion stages and analog components, reducing noise and distortion and resulting in a cleaner output signal closer to the original input signal. More generally, direct RF sampling reduces the overall complexity of the signal chain can increase reliability (i.e., reducing the points of failure within the signal chain) and lower costs.

Returning to the description of FIG. 2B, CE signal chain 200B shares many overlapping components with CE signal chain 200A. The input signal 202 undergoes digitization via ADC 206, processing by the baseband processor 208, and is then converted back into analog phase by DAC 210 to produce an output 214. In contrast to CE signal chain 200A, CE signal chain 200B leverages a higher resolution ADC 206 and DAC 210 for direct RF sampling. CE signal chain 200B can thus substitute frequency converters (i.e., down converter 204 and up converter 212) with mere signal conditioning blocks to perform impedance matching, attenuation, amplification, and/or filtering (omitted from FIG. 2B for clarity).

FIGS. 4, 5, 6A, and 6B illustrate a parallel calibration chain implemented within a direct RF sampling implementation similar to CE signal chain 200B. Of course, the signal chains of FIGS. 4, 5, 6A, and 6B may also be implemented with the up and down converters of CE signal chain 200A. Optional frequency converters are depicted within FIGS. 4, 5, 6A, and 6B in dashed grey lines to indicate that the signal chains may include leverage frequency conversion, if necessary. Again, frequency conversion will not be necessary when higher-speed ADC and DAC components are used (i.e., direct RF sampling).

In the following section, important concepts in the context of the disclosed system and methods for CE calibration, such as cross-correlation and auto-correlation, are introduced with reference to FIGS. 3A and 3B to aid in the subsequent description of the disclosed calibration approach.

Sequences Possessing Perfect Autocorrelation and Cross-Correlation Properties In the descriptions below of the disclosed calibration signal chain, a sequence generator is leveraged to create a secondary signal that is converted in analog, optionally upconverted, and coupled into the input port of the CE signal chain. Both signals traverse the CE signal chain, and because the internally created signal is known, it can then be received at the output, converted back to digital, and compared to the original signal. In many implementations, comparison of the received output signal to the original input signal includes extracting the difference in delay, phase, amplitude, and flatness and pass the extracted corrections to the baseband processing unit. The baseband processing unit acts upon the corrections to calibrate the delay, phase, amplitude, and flatness parameters. While the sequence generator can use any signal for calibration, there are choices that are more advantageous to the calibration process than others. For example, sequences like MaxL sequences have perfect autocorrelation and cross-correlation properties such that they behave similarly to noise. Unlike noise, the MaxL sequences are deterministically generated and can be perfectly recreated. These properties simplify the process of canceling the signal, thereby minimizing the interference to the original input signal of the CE signal chain. FIG. 3A provides an introductory basis for autocorrelation and cross-correlation properties, and FIG. 3B presents a variety of sequences that possess perfect autocorrelation and cross-correlation properties.

FIG. 3A illustrates a simplified comparison of the cross correlation 322 and autocorrelation 324 of two respective signals, a sequence represented by the waveform f (302) and a sequence represented by the waveform h (304). Cross-correlation is an operation measuring a similarity of two series as a function of the displacement of one series relative to the other, also referred to as a sliding dot product. FIG. 3A shows a visual representation of cross correlation 322, including the displacement of f (302) relative to h (304), as well as the displacement of h (304) relative to f (302). As shown in cross-correlation box 322, the cross-correlation operation f*h differs from the cross-correlation operation h*f based on which of the two series is being displaced. FIG. 3A also shows a visual representation of autocorrelation 324, which is the cross-correlation of a series with itself (i.e., h*h and f*f). A high-level explanation of cross-correlation and autocorrelation is provided with reference to visualizations 322, 324 prior to introducing the detailed mathematical operations with reference to FIG. 3B.

Regarding the cross-correlation 322 of two sequence functions f (302) and h (304), the cross-correlation operation f*h represents a method of determining how much h (304) must be shifted along the x-axis to align the peak (maximum) of f (302) with the peak of h (304). The sequence function h (304) is displaced, or shifted along the x-axis, whilst calculating the integral of the product of f (302) and h (304) at each point along the x-axis. The value of f*h is maximized at the point where the peaks of f (302) and h (304) align, because the positive areas under the curve of each respective function is maximized and will thus make a large contribution to the integral. This is illustrated for cross-correlation 322 at a plurality of points (indicated by arrows) at a particular displacement of the respective lagging function for both f*h and h*f with the overlapping positive area filled with cross-hatched shading. The cross-correlation functions f*h and h*f are each illustrated for the visualization of cross-correlation 322. As previously stated, a visualization is also provided for autocorrelation 324, which is the cross-correlation of a series with itself (i.e., h*h and f*f). Again, multiple example points are illustrated (indicated by arrows) at a particular displacement of the respective lagging function with the overlapping positive area filled with cross-hatched shading. Now that cross-correlation 322 and autocorrelation 324 have been introduced, their importance in the context of the technology disclosed will be discussed with reference to various sequences known to have perfect autocorrelation and cross-correlation properties.

FIG. 3B shows a plurality of sequences having perfect autocorrelation and cross-correlation properties such that each respective class of sequence resembles noise, a useful property for CE calibration. A pseudorandom binary sequence 306 is a common sequence leveraged as pseudorandom noise in signal processing and telecommunications applications. Pseudorandom binary sequences 306 are generated with a deterministic algorithm, and thus, are easy to replicate over multiple instances. However, a unique property of pseudorandom binary sequences 306 is that, while generated with a deterministic algorithm, these sequences exhibit near-truly random statistical behavior. A binary sequence, more generally, is defined as a sequence $\alpha_0, \ldots, \alpha_{N-1}$ of N bits such that $\alpha_j$ is an element of the set $\{0,1\}$ for $j=0, 1, \ldots, N-1$. As such, a binary sequence of N bits consists of N−m zeros and m ones. A pseudorandom binary sequence, compared to other binary sequences, is characterized by its autocorrelation function having only two values, m and mc, as defined by the equations shown for autocorrelation 326. The duty cycle, denoted c (and equivalent to the ratio of m−1 to N−1), is similar to the duty cycle of a continuous time signal.

A pseudorandom binary sequence 306 is "pseudorandom" despite being deterministic in nature because the value of an element $\alpha_j$ within the sequence is independent of the value of any other element in the sequence, similar to a true random sequence. Truly random sequences (e.g., white noise) are infinite, having no pre-determined end or cycle-period. A pseudorandom nonbinary sequence 306 is not truly random because the pseudorandom nonbinary sequence 306 becomes cyclical (and hence, non-random) when stretched to infinity. This predictability allows for pseudorandom nonbinary sequences 306 to be used as reproducible patterns.

The most common pseudorandom binary sequence 306 is a maximum length (MaxL) sequence 308, characterized by a pseudorandom binary sequence 306 of N bits, where $N=2^k-1$, with a duty cycle of ½. A MaxL sequence 308 can be generated using maximal linear-feedback shift registers. A MaxL sequence 308 is periodic and reproduces every binary sequence that can be represented by the shift registers except the zero vector, i.e., for a length-i register, the MaxL sequence 308 produces a sequence of length $2^i-1$.

MaxL sequences 308 are spectrally flat with the exception of a near-zero DC term, and are commonly used as pseudorandom sequences in digital communication systems that use spread spectrum communications. Spread spectrum is an umbrella of communications techniques by which a signal, generated with a particular bandwidth, is deliberately spread in the frequency domain over a wider frequency band. Many spread spectrum techniques (e.g., frequency-hopping spread spectrum and direct-sequence spread spectrum) use pseudorandom sequences, created using a sequence generator, to determine and control the spreading pattern of the signal across the allocated bandwidth. The technology disclosed can mathematically take advantage of the perfect autocorrelation properties possessed by a MaxL sequence 308 in order to extract a calibration signal from a measured output by taking its cross-correlation 322 with the MaxL sequence 308.

Other sequences possessing similar autocorrelation and cross-correlation properties include a Gold sequence 328, Zadoff-Chu sequence 368, and Constant Amplitude Zero Auto-Correlation (CAZAC) sequence 346. A set of Gold sequences 328 consists of $2^k+1$ sequences, each with a period of $2^k-1$. A set of Gold sequences 328 can be generated by selecting two MaxL sequences 308 of the same length $2^k-1$ such that their absolute cross-correlation 322 is less than or equal to $2^{(k+2)/2}$. A Zadoff-Chu sequence 368 is a complex-valued sequence that, when applied to a signal, gives rise to a new signal of constant amplitude. Zadoff-Chu sequences 368 exhibit the advantageous property that cyclically shifted versions of themselves are orthogonal to one another, reducing interference. Zadoff-Chu sequences are a type of CAZAC sequence 346, which generally refers to a periodic complex-valued signal with modulus one and out-of-phase cyclic autocorrelations of zero. CAZAC sequences 346 are commonly used in wireless communication sequences.

Any sequence with perfect autocorrelation properties can be used to extract a calibration signal using the above-described cross-correlation approach, but signals with high crest factor (i.e., more extreme peaks) produce responses with poor signal-to-noise ratio (SNR). MaxL sequences, in contrast, are advantageous because the digital crest factor of a MaxL sequence 308 is 0 dB. Put differently, a calibration sequence produced by a calibration signal chain leveraging a generated MaxL sequence 308 can be operated at near or below the desired signal noise floor, making it potentially undetectable. Additionally, when the calibration signal is made coherent with the input sequence passing through the CE signal chain, it can be canceled using cross-correlation to minimize interference. The disclosed calibration signal chain will now be described further.

Figure 4:
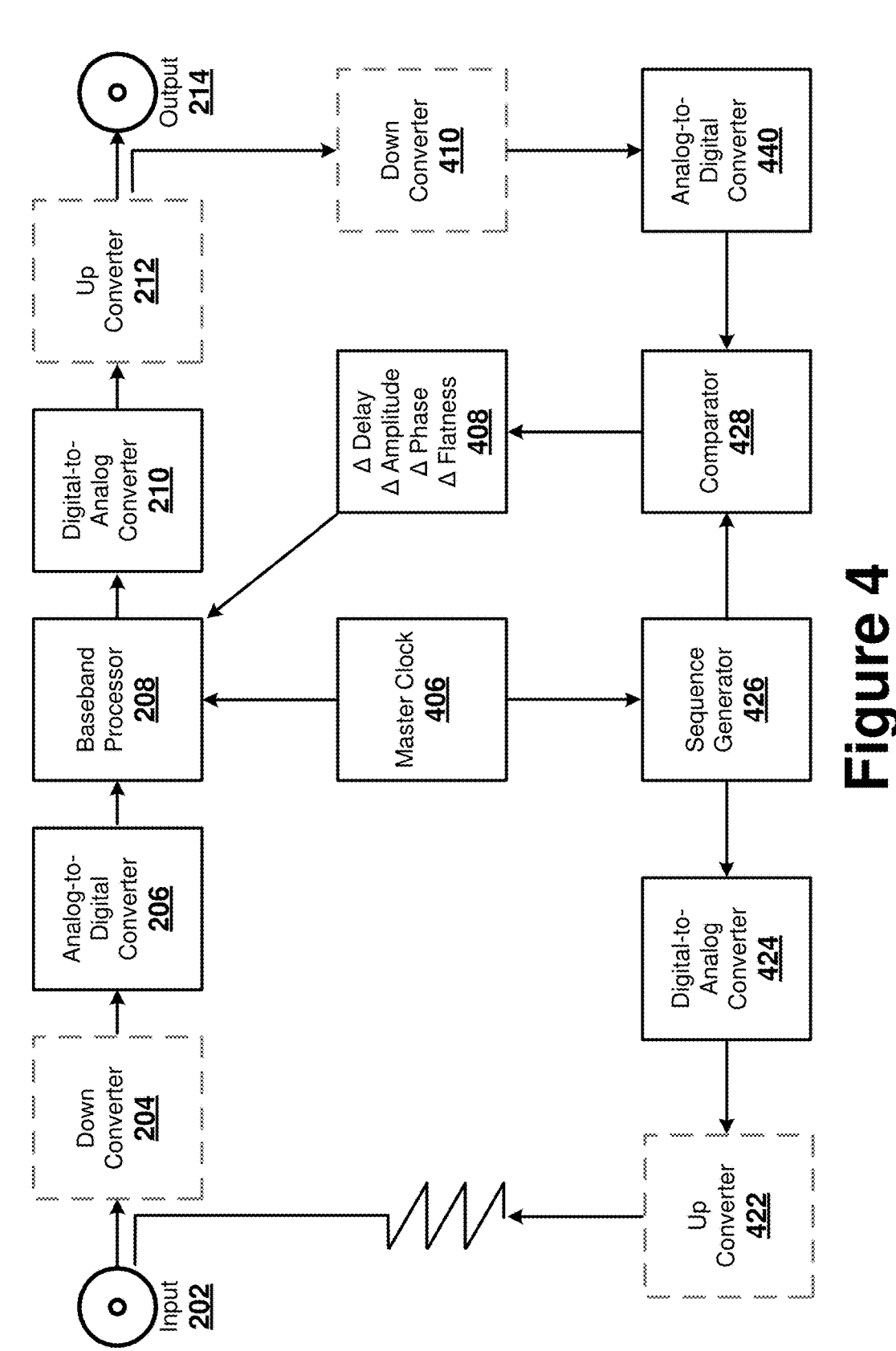
FIG. 4 shows a schematic diagram of a CE signal chain further including a calibration signal chain.

Addition of a Secondary Calibration Signal Chain to a Channel Emulator Signal Chain FIG. 4 shows a schematic diagram 400 of a CE signal chain further including a calibration signal chain. Building on FIGS. 2A and 2B, FIG. 4 includes a CE signal chain with an input signal 202, an optional down converter 204, ADC 206, baseband processor 208, DAC 210, an optional up converter 212, and an output signal 214. The description of components 202, 204, 206, 208, 210, 212, 214 overlaps with that of FIGS. 2A and 2B and hence will not be re-stated for the sake of conciseness. Frequency converters 204, 212 are optional (as depicted in FIG. 4 by the dashed lines) depending on whether an implementation analogous to FIG. 2A is used, including down and up conversion, or an implementation analogous to FIG. 2B is used, including direct RF sampling that negates the necessity of down converting the input signal. In contrast to FIGS. 2A and 2B, diagram 400 further includes a secondary calibration signal chain.

The calibration signal chain includes a sequence generator 426 that creates a calibration signal, based on modulation of a sequence such as a MaxL sequence, previously described, that is converted to analog by a DAC 424 and further coupled to an input port such that the newly created signal is added to input signal 202. Both signals then traverse the original CE signal chain. The level of the newly created calibration signal may be set to a predetermined level or adjusted based on the SNR at the output, obtained by observing the correlation peak of the signal. The internally created signal is known, and hence, can be received at the output 214, converted back to digital by an ADC 440, and compared to the original signal by a comparator 428. The comparator 428 can perform various means of processing, such as correlation detection. The comparison of the internally created signal to the original signal that transited the upper CE chain can include determining the difference in delay, phase, amplitude, and flatness 408 to correct said parameters. The correction parameters are then passed to the baseband processor 208 so that the baseband processor 208 can act upon these corrections 408 and maintain the delay, phase, amplitude, and flatness parameters at predefined target values. It is possible to extract the newly created calibration signal from the output signal in order to perform the comparison and correction because of the aforementioned autocorrelation and cross-correlation properties of the sequence being used, such as a MaxL sequence. In a non-direct RF sampling implementation wherein frequency conversion is necessary, an additional up converter 422 and down converter 410 are added to the calibration signal chain accordingly. FIG. 4 further includes a master clock 406 that sends a clock signal to the baseband processor 208. The master clock 406 is centralized on a backplane to avoid skew due to path length. In other implementations, a distributed system without a backplane or chassis is used, relying on data centers (e.g., employing Precision IEE 1588 or similar proprietary implementations) for synchronization.

In a modern CE, there are often tens or hundreds of signal chains (e.g., a MIMO system with M inputs and N outputs) and all signal chains must be kept aligned in delay, phase, amplitude, and flatness when in use for accurate measurements. In an environment with M inputs, each signal chain can be configured with its own respective calibration chain such that there are M calibration chains as well. In another implementation, fewer than M calibration chains are used and the pairing of a calibration chain is switched between more than one signal chain. In many implementations, many signal chains converge in the same input port or output port. The technology disclosed can be implemented with a subset of parallel signal chains, i.e., the MaxL sequences created in each respective calibration chain are orthogonal to one another to prevent interference and allow for the respective calibration chains to compensate for delay, amplitude, phase, and flatness on a per-signal chain basis, operating in parallel.

In another implementation, a single calibration chain is implemented within a routing network with RF switches to switch between different input/output port combinations. This implementation is represented in FIG. 5.

Figure 5:
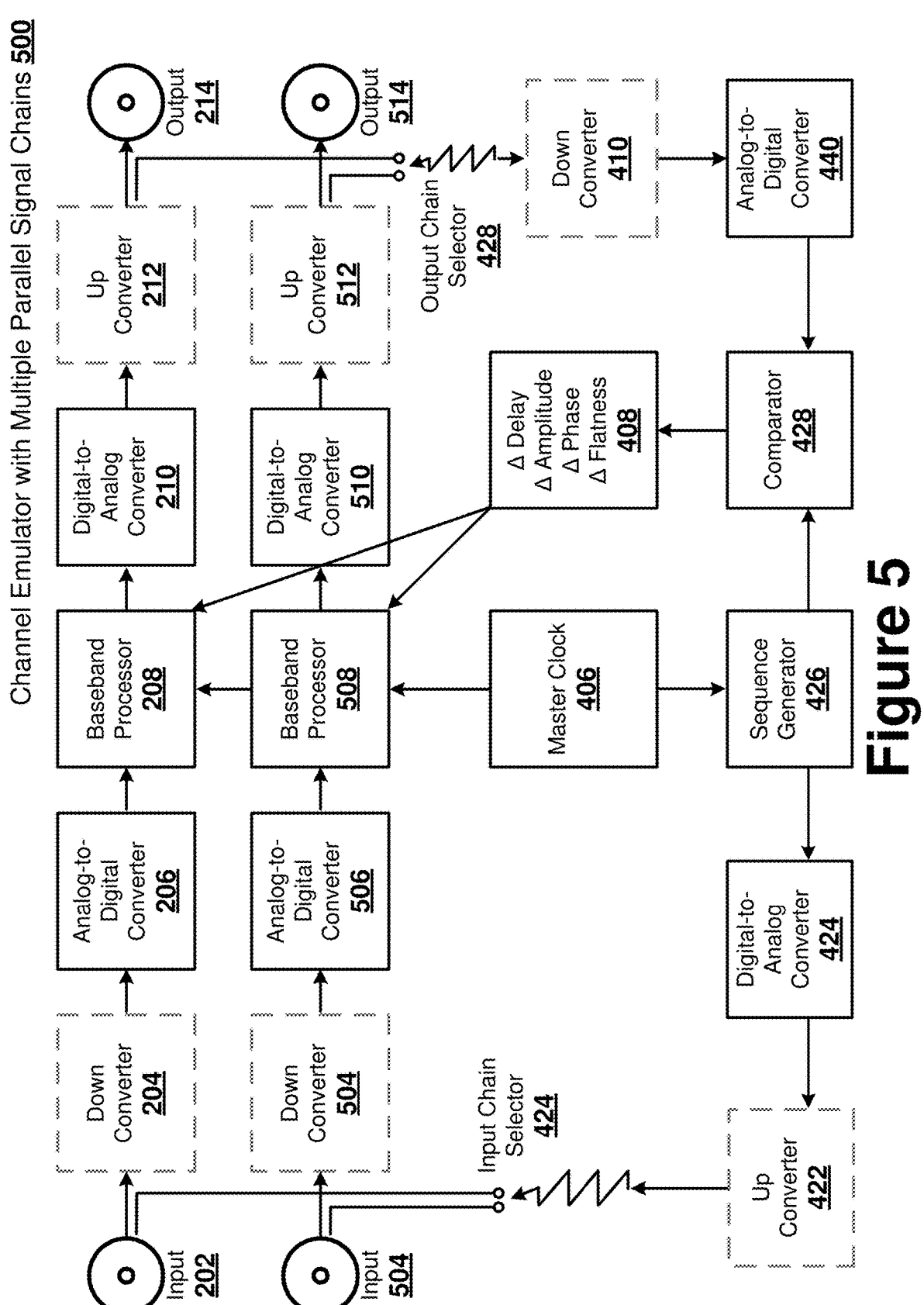
FIG. 5 shows a schematic diagram of a CE signal chain similar to that of FIG. 4, further including multiple parallel signal chains.

FIG. 5 shows a schematic diagram 500 of a CE signal chain similar to that of FIG. 4, further including multiple parallel signal chains and a calibration chain. Diagram 500 includes a first CE signal chain with an input signal 202, an optional down converter 204, ADC 206, baseband processor 208, DAC 210, an optional up converter 212, and an output signal 214. In contrast to diagrams 200A, 200B, and 400, diagram 500 further includes a second signal chain with a separate input 504 and output 514. This second signal chain contains analogous components to the first signal chain including an optional down converter 504, an ADC 506, baseband processor 508, DAC 510, and optional up converter 512. FIG. 5 further includes a single calibration chain, including sequence generator 526, DAC 424, an optional up converter 422, ADC 440, and comparator 428 that passes delay, amplitude, phase, and flatness corrections 408 to baseband processor 208 or baseband processor 508. FIG. 5 further includes master clock 406, as previously described.

The calibration chain of diagram 500 can be coupled to either input 202 or input 504, switching between the two using input chain selector 424. Similarly, the calibration chain of diagram 500 can be coupled to either output 212 or output 514, switching between the two using output chain selector 428. The system of diagram 500 can measure and adjust parameter values to achieve a target response with alignment of phase, amplitude, delay, and flatness for multiple parallel signal chains as well as matching of target channel characteristics selected for emulation such as multipath delays, reactive delay powers, phase offsets relating to beamforming, gain balance between ports, delays associated with modeling array elements, and/or distances between antenna elements. A cross-correlation between different signal paths can be calculated based on periodic sampling of amplitude and phase values from each respective path. Similarly, an autocorrelation may be calculated for a single signal chain from periodically sampling the same signal path.

In addition to calibrating parameters like phase, amplitude, delay, and flatness, the technology disclosed can also be used to measure real-time impairments being generated by the channel emulator during operation. The real-time measurement of impairments is performed by cancelling the input signal from the output observation, as previously described, and determining the Power Delay Profile (PDP), Autocorrelation/Doppler Spectrum, cross-polarization discrimination ratio (XPR), fading cumulative and probability density functions (CDF/PDF) on a per radio link basis or per output port basis, a correlation matrix of the M×N radio links, SNR on a per radio link basis or per output port basis, and so on.

Figure 6A:
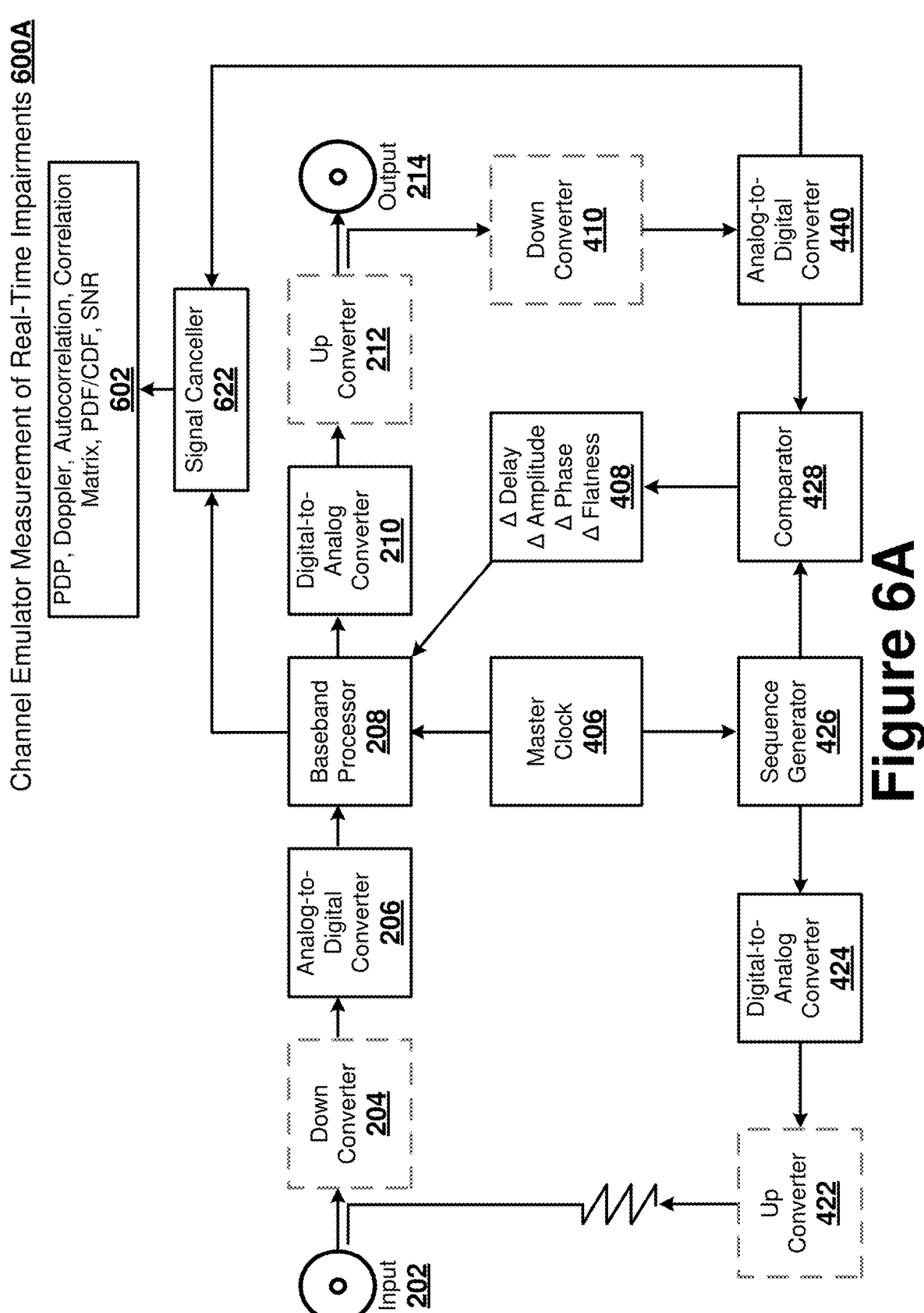
FIG. 6A shows a schematic diagram of a CE signal chain similar to that of FIG. 4, further configured for measurement of real-time impairments generated by the CE.

FIG. 6A shows a schematic diagram 600A of a CE signal chain similar to that of FIG. 4, further configured for measurement of real-time impairments being generated by the CE. Many of the components of diagram 600A overlap with those of diagram 400, including the CE signal chain and calibration chain, and these overlapping components will not be re-stated for the sake of conciseness. Diagram 600A further includes a signal canceller 622 configured to cancel the input signal from the output observation, as stated above. Once the input signal has been cancelled, it is possible to measure a plurality of various metrics 602 relating to impairments generated by the CE, such as PDP, autocorrelation, Doppler Spectrum, XPR, CDF/PDF, etc., as described above. These metrics 602 are examples provided for illustrative purposes, and a skilled user will recognize alternative metrics that may be used without departing from the spirit or scope of the technology disclosed.

Real world RF environments encounter a number of impairments, such as time delay, Doppler shift (e.g., when the relative motion between one or more antennas, such as a satellite moving over a ground receiver, alters the frequency of the signal) and a number of hardware induced distortions including signal compression and intermodulation distortion. Channel models can be constructed, including the modeling of various impairments to the communication path, to assist in the anticipation and correction of signal impairments in real world environments. To this end, CEs are used to simulate real-world conditions, including the introduction of various impairments and signal distortion.

Validation of the channel model is important in order to verify that the CE generates the intended impairments. To this end, many validation techniques can be used that are readily apparent to a user skilled in the art. The nature of the input signal for validation will vary in dependence on the parameter to be validated. A non-exhaustive subset of example validation techniques follows. To validate PDP, a wideband signal is used. To validate Autocorrelation, Doppler spectrum, or a correlation matrix, a single tone (also referred to as a continuous wave tone) is used. In some implementations, the sequence generator of the calibration chain is an arbitrary waveform generator (AWG). In these implementations including an AWG, additional measurements for test and validation purposes can include Error Vector Magnitude (EVM), two-tone testing of intermodulation products, and load/source pull measurements. Calculation of EVM, also referred to as residual constellation error or relative constellation error, is performed to measure signal chain fidelity in terms of amplitude and phase distortions. Measurement of load/source pull is performed to find an optimal power amplifier operating point.

Figure 6B:
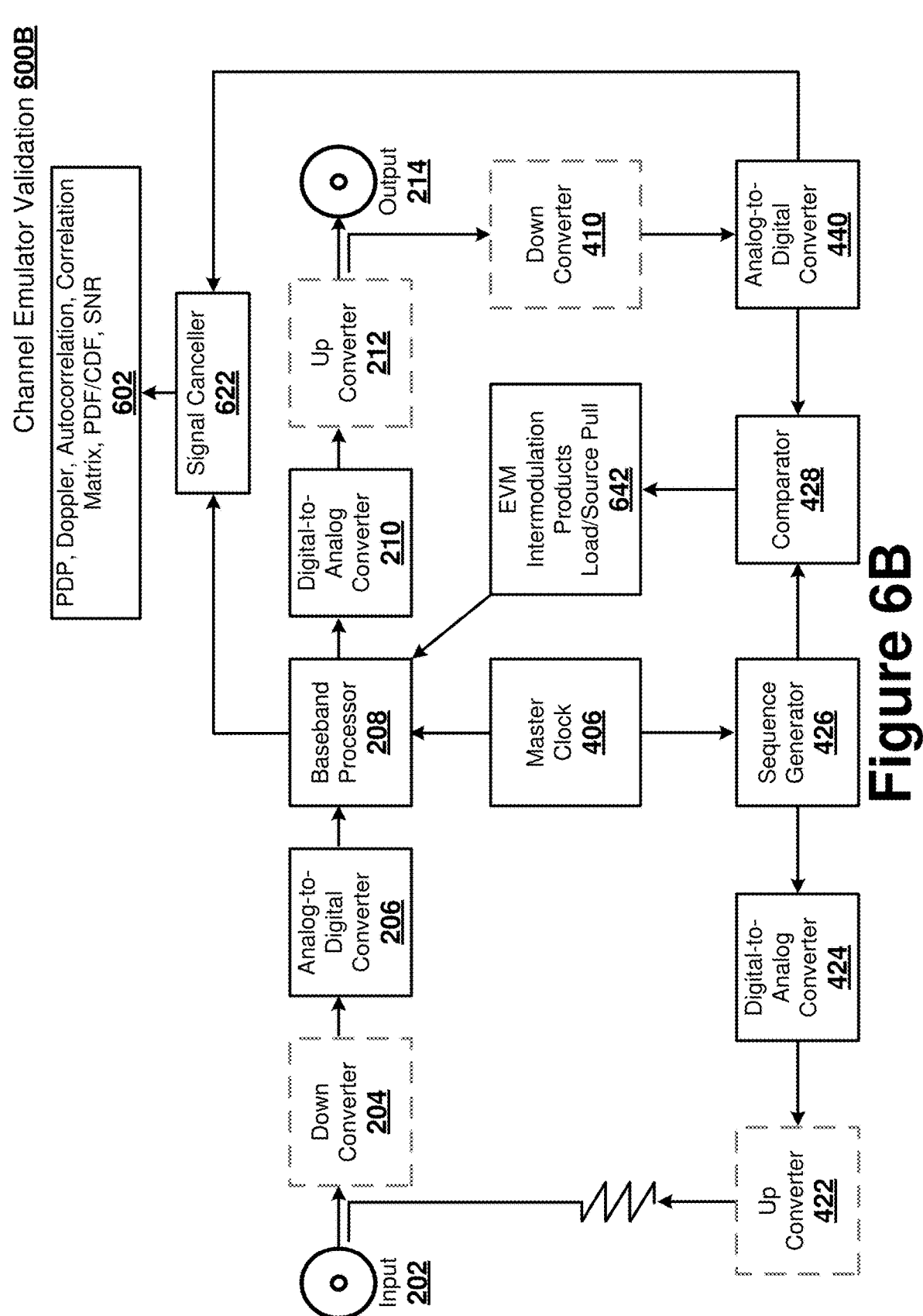
FIG. 6B shows a schematic diagram of a CE signal chain similar to that of FIG. 4, further including example validation components.

FIG. 6B shows a schematic diagram of a CE signal chain similar to that of FIG. 4, further including example validation components. Many of the components of diagram 600B overlap with those of diagram 600A, including the CE signal chain, calibration chain, signal canceller, and validation metrics, and these overlapping components will not be re-stated for the sake of conciseness. In contrast to the delay, amplitude, phase, and flatness parameters 408, diagram 600B measures the above-described measurements 642 associated with use of an AWG, including EVM, intermodulation products, and load/source pull. Next, examples of selected validation procedures are provided for illustrative purposes, including measurement of intermodulation products (FIGS. 7 and 8) and EVM (FIG. 9).

Figure 7:
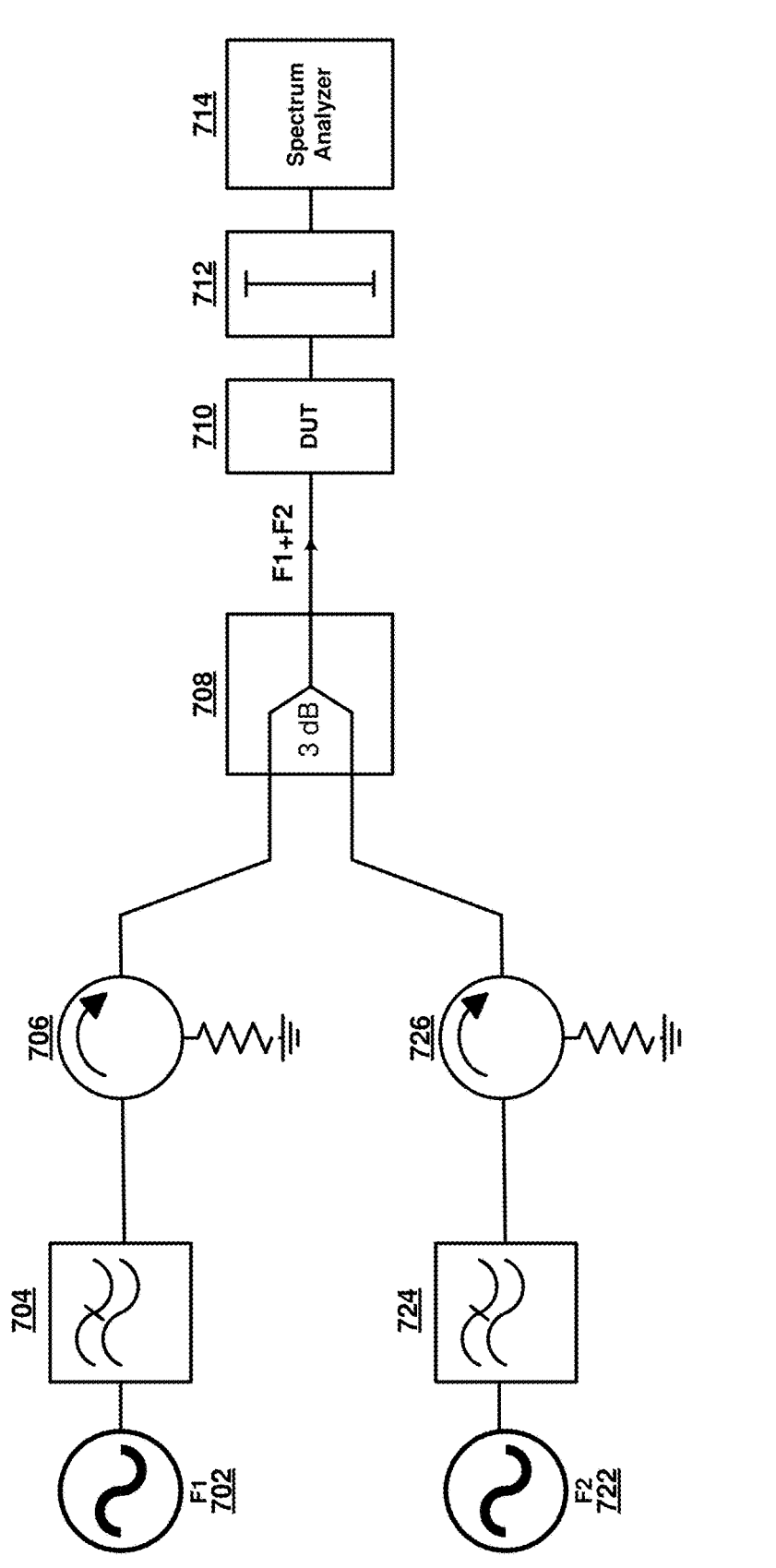
FIG. 7 shows a schematic diagram of a two-tone test for intermodulation distortion.

FIG. 7 shows a schematic diagram 800 of a two-tone test for intermodulation distortion. Two-tone testing is a means of testing intermodulation distortion in RF systems. In a two-tone test, two input sinusoids of different frequencies (i.e., two tones) are passed through the system, such as the disclosed CE, and using a spectrum analyzer to observe intermodulation products (described in further detail with reference to FIG. 8). In an RF test environment, non-linearity causes harmonic distortion at the output, a form of signal amplitude distortion that adds overtones at whole number multiples of the input frequencies. Intermodulation products occur from the sum and difference of the input signals and the harmonics. In the two-tone diagram 700, a first signal generator is used to generate a first analog signal of a frequency F1 702 and a second signal generator is used to generate a second analog signal of a different frequency F2 722. In some implementations, low-pass filters 704, 724 are respectively coupled to the generator outputs to remove any harmonic distortion of signals F1 702 and F2 722 to mitigate test inaccuracies. The input signals F1 702 and F2 722 are passed through a power combiner 708 via circulators 706, 726. The power combiner 708 is depicted as a 3 dB coupler, but a different coupling factor may be used in other implementations. The circulators 706, 726 share a single port connected to a resistive load, such that the circulators act as isolators (i.e., transmit RF power unidirectionally). The combined F1+F2 signals pass through a device under test 710 (or the disclosed CE) and the resulting output 712 is fed to a spectrum analyzer 714 to observe the results. Example spectra with harmonics and intermodulation distortions is provided in FIG. 8.

Figure 8:
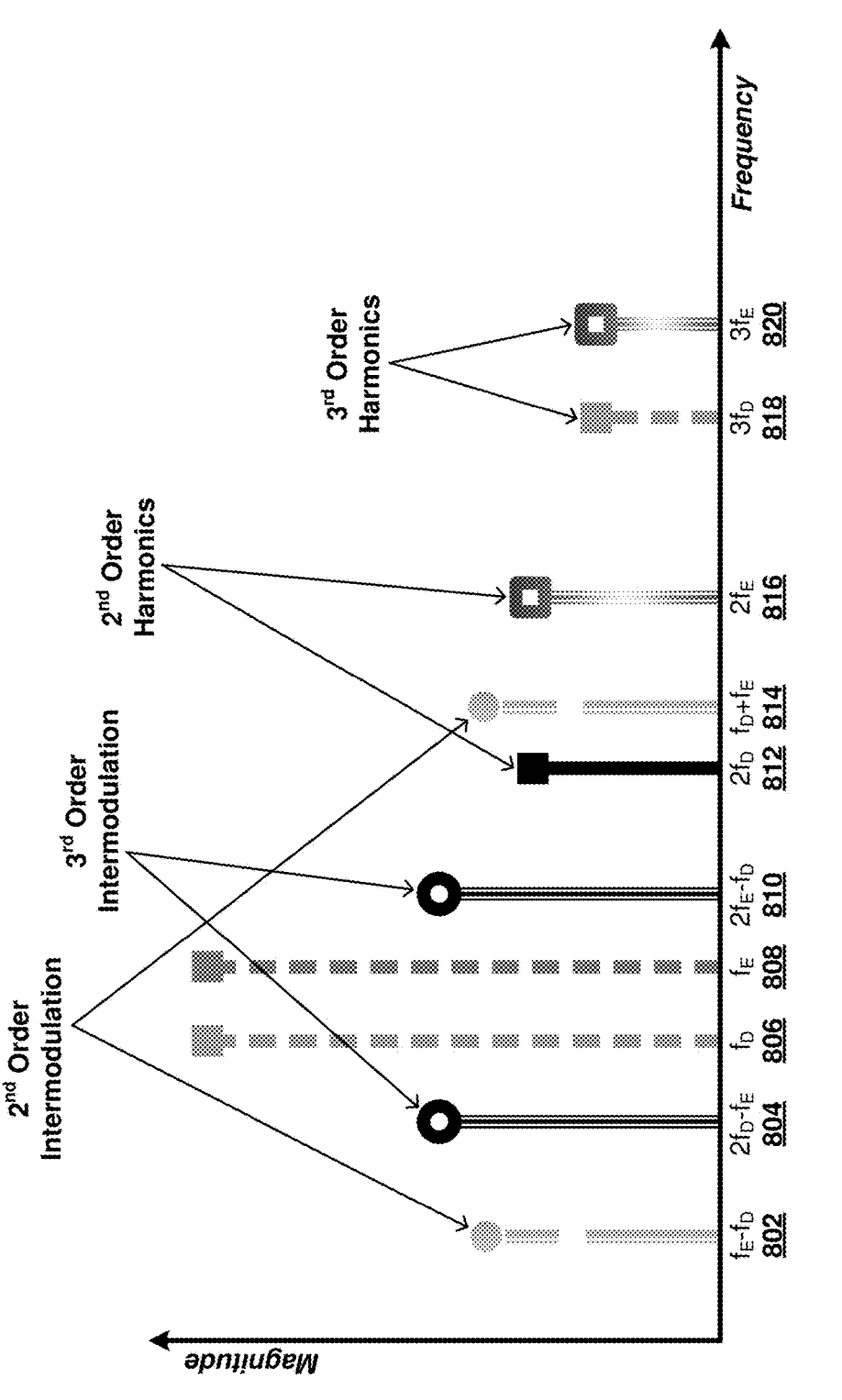
FIG. 8 depicts second and third order intermodulation.
Figure 9:
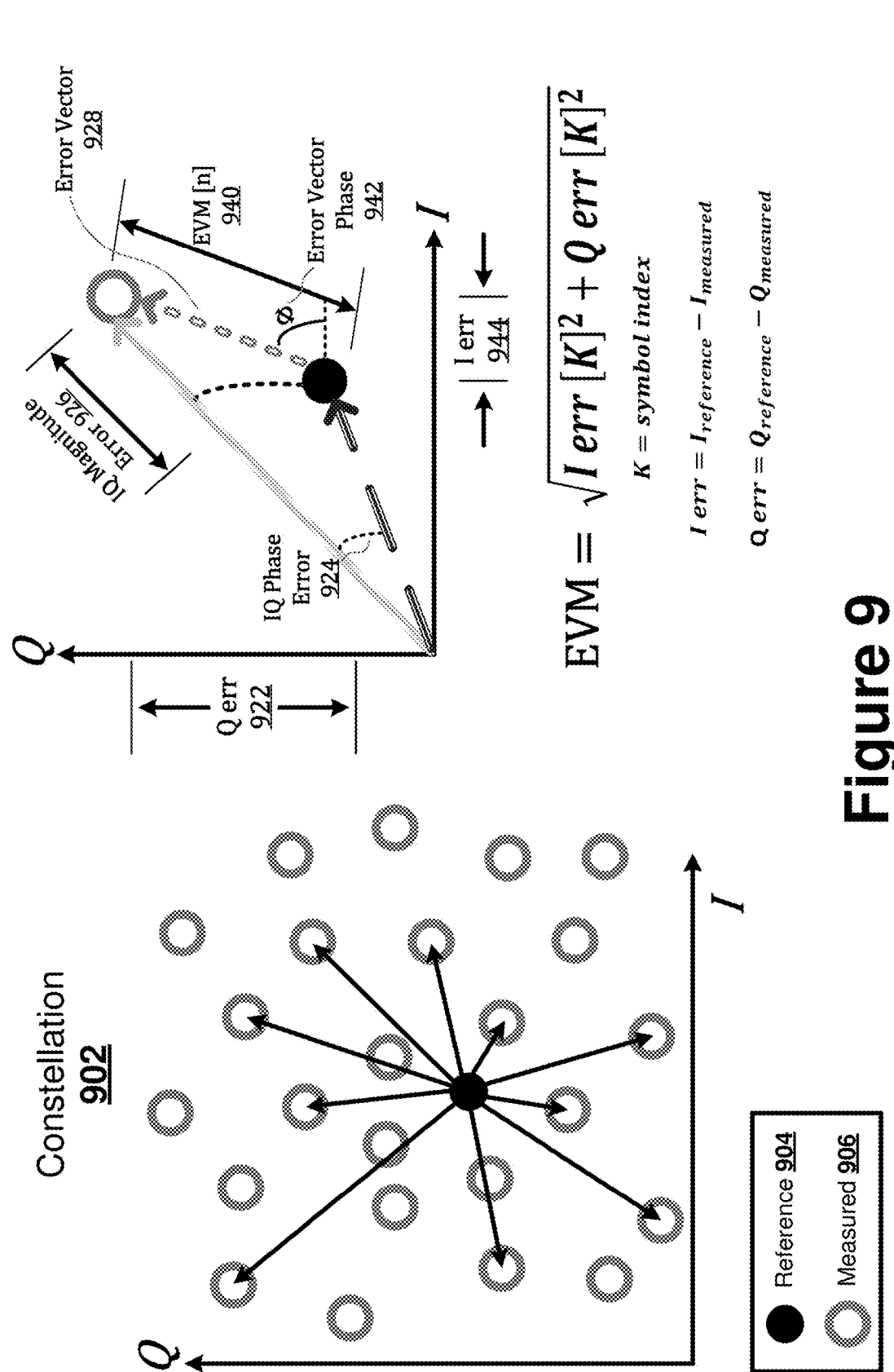
FIG. 9 depicts the calculation of error vector magnitude (EVM) from a constellation diagram.

FIG. 8 depicts second and third order intermodulation. As described above, intermodulation distortion is a form of amplitude modulation of signals containing at least two different frequencies arising from nonlinearities and/or time variance. The intermodulation between frequency components produces additional frequencies to the harmonic frequencies at the sum and difference frequencies of the original signal frequencies and their harmonic frequencies. In a first example with three frequency components, $F_A$, $F_B$, and $F_C$. In addition to the frequency components $F_A$, $F_B$, and $F_C$, a number of linear combinations of $F_A$, $F_B$, and $F_C$ exist in the form $k_A F_A + k_B F_B + k_C F_C$, where $k_A$, $k_B$, and $k_C$ are arbitrary integers. These linear combinations comprise third-order intermodulation products (IMPs) occurring where the sum of the absolute values of $k_A$, $k_B$, and $k_C$ equals 3. The resulting IMPs are third-order IMPs including: $F_A + F_B + F_C$; $F_A + F_B - F_C$, $F_A + F_C - F_B$; $F_B + F_C - F_A$; $2F_A - F_B$; $2F_A - F_c$; $2F_B - F_A$; $2F_B - F_C$; $2F_C - F_A$; and $2F_C - F_B$. However, third-order intermodulation distortion can be observed with only two frequency components as well.

The description with reference to FIG. 8 relates to an example input signal containing two frequency components, $F_D$ and $F_E$. Linear combinations of $F_D$ and $F_E$ similarly exist in the form $k_D F_D + k_E F_E$, where $k_D$ and $k_E$ are arbitrary integers. Second-order IMPs occur where the sum of the absolute value of $k_D$ and $k_E$ equals 2, including: $F_D + F_E$ and $F_E - F_D$. Third-order IMPs occur where the sum of the absolute value of $k_D$ and $k_E$ equals 3, including: $2F_D - F_E$ and $2F_E - F_D$. These second-order and third-order IMPs, as well as harmonics, are depicted in the graph of FIG. 8.

The graph of FIG. 8 shows two frequency components of a signal, $F_D$ 806 and $F_E$ 808. Second-order harmonics (i.e., overtones at a multiple of $kF_N$ where $|k|=2$) result in $2F_D$ 812 and $2F_E$ 816. Third-order harmonics (i.e., overtones at whole number multiples $k_N F_N$ where $|k|=3$) result in $3F_D$ 818 and $3F_E$ 820. Intermodulation products further arise from the sum and difference of the fundamental frequencies, $F_D$ 806 and $F_E$ 808, and the harmonic frequencies $2F_D$ 812, $2F_E$ 816, $3F_D$ 818, and $3F_E$ 820. Second-order IMPs, as determined above, accordingly result at $F_D + F_E$ 814 and $F_D - F_E$ 802. Third-order IMPs, as determined above, accordingly result at $2F_D - F_E$ 804 and $2F_E - F_D$ 810. The discussion now turns to another example validation procedure involving the calculation of EVM.

EVM is a metric that can be used to quantify the performance of a radio transmitter or receiver. EVM, at a high level, is a measure of how far measured points in a constellation are from the ideal locations for the constellation points. A constellation diagram is a representation of a signal modulated by a digital modulation scheme on a two-dimensional scatter diagram at sampling instants of the symbol, or modulation rate. In a digital modulation system, data is transmitted in a series of samples each occupying a uniform time slot. During each sample, the carrier wave has a constant amplitude and phase. Each sample encodes one of a finite number of symbols encoded as a different combination of amplitude and phase of the carrier, and each symbol can be represented by a point on a constellation diagram as a constellation point. The constellation diagram is analogous to a heat map of I/Q data (amplitude modulation of the I and Q phases of a sign wave), in which (1) the angle of a point measured counterclockwise relative to the horizontal axis represents the phase shift of the carrier wave from a reference phase, and (2) the distance of the point measured relative to the origin represents a measure of the signal amplitude.

In practice, various imperfections (e.g., carrier leakage, phase noise, etc.) result in deviation of the constellation points from their corresponding ideal theoretical locations. Noise, distortions, phase noise, and so on cause signal impairments that result in degradation of EVM (i.e., higher error values) and thus, EVM provides a quality metric for a signal sent by a transmitter and/or received by a receiver.

FIG. 9 depicts the calculation of error vector magnitude (EVM) 900 from a constellation diagram. A given error vector for a constellation point is a vector connecting a reference constellation point and a measured constellation point, i.e., the difference between the ideal symbol and the true received symbol. The EVM is computed as the root mean square (RMS) average amplitude of the error vector, normalized to the ideal signal amplitude reference.

FIG. 9 includes a constellation diagram 902, including a reference point 904 and a plurality of measured constellation points 906. Error vectors can be computed for a particular measured constellation point 906 relative to the reference point 904, and the overall EVM can be computed as the RMS average amplitude of the error vectors. A function for computing EVM 900 is included within FIG. 9. An example is depicted for a given measured constellation point 906 to the right of constellation 902. One-dimensional error can be determined for each axis, i.e., both a $Q_{err}$ 922 and an $I_{err}$ 944, measuring the distance between the reference point and the measured point on the Q-axis and the I-axis. The IQ magnitude error 926 is depicted as well, parallel to a first vector intercepting the origin and the measured constellation point 906. In addition to the first vector intercepting the origin and the measured constellation point 906, a second vector also exists that intercepts the origin and the reference constellation point 904, and a vector that intercepts the measured constellation point 906 and the reference constellation point 904. The latter vector intercepting the measured constellation point 906 and the reference constellation point 904 is the error vector 928. Additionally, the IQ phase error 924 can be obtained as the angle between the first and second vectors intercepting the origin, and the error vector phase 942 can be obtained as the angle between the second vector and the error vector 928.

The real-time impairments of the CE signal can be further logged and stored in memory for offline display and additional analysis. In some implementations, the calibration plane extends to the center of the test volume of an anechoic chamber for an over-the-air (OTA) scenario.

In OTA scenarios, the channel emulator adds a special input "Cal," wherein the signal picked up by a probe inside the anechoic chamber is passed back to the CE for comparison and correction, as previously described, or for displaying the impairments created by the CE. In other embodiments, multiple distributed CEs are used in combination with centralized signal processing, and frequency conversion (i.e., up conversion and down conversion) occurs in a remote radio unit. In implementations including a remote radio unit, the analog and digital aspects of the compensation network can be in separate locations. The sensing locations used for the technology disclosed may be further extended beyond the CE to encompass various peripherals, such as RF cables, amplifiers, antenna probes used to transmit OTA signals, and/or connections to the antenna circuitry of a device-under-test. The delays, signal loss, and flatness associated with an RF cable or an extension of the measurement plane to a point of measurement can be pre-calibrated. A calibration implementation can include an end-to-end path, including the CE and any added peripherals, including delays caused by cables and/or RF propagation. In an alternative implementation, a signal can be coupled from each probe antenna and selected at the Cal input as described previously, thereby allowing the calibration reference plane to be set at each probe to allow operation without a separate calibration probe. An extension of the calibration plane can also be extended at the input to include additional components such as a network emulator (NE) or an access point generating a specific calibration signal based on an air interface, as well as cabling, amplifiers, combiners, RF circulators, and similar standard components of RF environments.

When antenna arrays of a large size are used at certain channel bandwidths, accuracy can be improved by accounting for the delays associated with each element individually rather than a single measurement for the phase at a center frequency. To achieve this, the delays associated with a modeled array can be added and adjusted to achieve target delays for each individual array element. If a channel within a chamber or shield box is to be removed from the setup, the calibration system and methods disclosed can be utilized to automatically adjust the phase and gain of certain port connections to invert the channel matrix present in the chamber. Furthermore, the calibration system and methods disclosed can be utilized to automatically apply the adjusted valued to produce an emulation of a corrected channel with equal gain and minimum crosstalk for each respective port at the CE to each port at a device-under-test.

One implementation of the technology disclosed includes supporting bandwidth concatenation, in which the impulse response, band flatness, and phase response of two or more concatenated bands are measured and leveraged to select filter coefficients that can correct for artifacts produced by nonideal combinations of the two or more pass bands. The discussion now turns to additional particular implementations of the technology disclosed.

Particular Implementations

We describe various implementations of a CE configured to perform self-calibration. The CE includes at least one CE signal chain and at least one integrated parallel calibration signal chain. A CE signal chain of the CE includes an input, coupled to a first signal conditioner, the first signal conditioner being coupled to a first analog-to-digital converter, the first analog-to-digital converter being coupled to a dynamically calibrated baseband processor, the dynamically calibrated baseband processor being coupled to a second signal conditioner, and the second signal conditioner being coupled to an output. The baseband processor receives a clock signal from a master clock. A calibration signal chain of the CE includes a sequence generator including a signal modulator and a comparator. The sequence generator is configured to receive the clock signal from the master clock, generate a pseudo-random sequence, and produce a calibration analysis signal overlaying the pseudo-random sequence. On a supplying side, the sequence generator is coupled to a second DAC to supply the calibration analysis signal to be processed by the CE signal chain. On an evaluating side, the sequence generator is coupled to the comparator to evaluate results of the processed calibration analysis signal, received from the channel emulator signal chain.

In one implementation, the first signal conditioner is coupled to a first down converter that is coupled to the first ADC and the baseband processor is coupled to a first up converter coupled to a second signal conditioner. Implementations of the CE can include, on the supplying side, the second DAC coupled to a second up converter coupled to the input of the CE signal chain. On the evaluating side, the output of the CE signal chain is coupled to a second down converter that is coupled to a second ADC, and the second ADC is coupled to the comparator. An output of the comparator can be coupled to the dynamically calibrated baseband processor as a calibration analysis signal to correct parameters of the signal chain. A sequence generation logic of the sequence generator generates a wideband signal, a two-tone signal, or a signal tone signal (i) for the processing by the channel emulator signal chain and (ii) for the use by the comparator in an evaluation of the results of the processed calibration analysis signal.

In many implementations, an evaluation of the results of the processed calibration analysis signal further includes selecting at least one signal component received from the output corresponding to a processed calibration analysis signal, delay and time matching a calibration analysis signal sent to the input of the channel emulator signal chain with the output corresponding to a processed calibration analysis signal, analyzing differences between a calibration analysis signal sent to the input of the channel emulator signal chain and the output corresponding to a processed calibration analysis signal, and processing the analyzed differences to derive adjustments in parameters used by the dynamically calibrated baseband processor, wherein the parameters include one or more of a delay parameter, an amplitude parameter, and a flatness parameter. The sequence generated by the sequence generator may be a MaxL sequence, a generalized chirp-like sequence, or a Zadoff-Chu sequence.

Some implementations include using test measurements and calibration to store correction values in the CE for future uses. In one implementation, the calibration system is completely external to the CE. In another implementation, a series of diagnostic tests can be run for the calibration system and the reported results can be transmitted to a computing device via a wired or wireless connection for storage. In yet another implementation, the calibration system detects that a particular hardware or software associated value is out of range, reports the out-of-range result, and stores the out-of-range result to a computing device. The value may correspond to a parameter such as phase drift, amplitude drift, delay drift, signal levels, flatness, etc.

One disclosed method further includes correcting for parameters including level, flatness, drift, delay, correlation, crosstalk, beam pointing, and/or chamber response. Other disclosed methods further include applying a pre-defined or standardized channel model to be verified such that any parameters out of a pre-determined range of tolerance will trigger a warning message.

The technology disclosed can be practiced as a system, method, or article of manufacture. One or more features of an implementation can be combined with the base implementation. Implementations that are not mutually exclusive are taught to be combinable. One or more features of an implementation can be combined with other implementations. This disclosure periodically reminds the user of these options. Omission from some implementations of recitations that repeat these options should not be taken as limiting the combinations taught in the preceding sections—these recitations are hereby incorporated forward by reference into each of the following implementations.

A method implementation of the technology disclosed includes the channel emulator, including a dynamically calibrated baseband processor, invoking at least one integrated calibration signal chain from a channel emulator signal chain, wherein the integrated calibration signal chain includes a sequence generator, and the sequence generator further includes a signal modulator. The sequence generator generates a pseudo-random sequence and the signal modulator overlaying a calibration analysis signal on the pseudo-random sequence, wherein the calibration analysis signal is a wideband signal, a two-tone signal, or a single tone signal to be processed by the channel emulator signal chain. The sequence generator also supplies the calibration analysis signal to be processed by the channel emulator signal chain and supplying the calibration analysis signal to a comparator to evaluate results of the calibration analysis signal processed by the channel emulator signal chain.

In many implementations, evaluation of the calibration results further includes selectively filtering at least one signal component from the output of the channel emulator signal chain, the selected signal component corresponding to a processed calibration analysis signal, delay and time matching the calibration analysis signal sent out to the input of the channel emulator signal chain with the processed calibration analysis signal received from the output of the channel emulator signal chain, and analyzing differences between the calibration analysis signal and the processed calibration analysis signal received, and deriving, from the analysis, adjustments in delay, amplitude, phase, and flatness parameters. The method can also include the comparator passing the derived adjustments to the baseband processor, and/or the comparator storing the derived adjustments in a memory for future use. In one implementation, the comparator detects an out-of-range value for the delay, amplitude, phase, and flatness parameters and reports the detected out-of-range value to a user.

In some implementations, the disclosed calibration system is used to modify channel model characteristics to achieve target characteristics related to the application of external networks, thereby accounting for changes introduced by the external network such as amplifiers, cables, probes, and/or different propagation distances. In one implementation, the CE is calibrated before and after a test is performed instead of concurrently with the test. Measurements from before and after the test can be compared to detect variability. In other implementations, calibration is repeated in periodic intervals.

This system implementation and other systems disclosed optionally include one or more of the following features. System can also include features described in connection with methods disclosed. In the interest of conciseness, alternative combinations of system features are not individually enumerated. Features applicable to systems, methods, and articles of manufacture are not repeated for each statutory class set of base features. The reader will understand how features identified in this section can readily be combined with base features in other statutory classes.

In addition to correcting delay, amplitude, phase, and flatness, the center of the test zone may be adjusted/relocated to compensate for positioning error. In some implementations, an initial amplitude and/or phase calibration can be performed using an OTA signal via a test antenna, recording intermediate amplitudes and/or phase values at different points along the measurement chain, and updating the amplitude and/or phase at the different points along the measurement chain to maintain the intermediate values when the probe is not available.

Other implementations may include a non-transitory computer readable storage medium storing instructions executable by a processor to perform functions of the system described above. Yet another implementation may include a method performing the functions of the system described above.

Various implementations of the technology disclosed include any of the methods described herein, wherein a band concatenation of two or more signal chains that are offset in frequency can be calibrated and tuned for level, band flatness, and delay. In one implementation, a single calibration chain is used and an RF distribution network including RF switches is used to route signals to a desired input and/or output port combination within a MIMO configuration. In an alternative implementation, there is a single calibration chain, and a digital distribution network is created in order to route signals to a desired input and/or output port combination within a MIMO configuration. In other implementations, multiple calibration chains are used.

One implementation includes a signal canceller receiving the evaluated results of the calibration analysis signal processed by the channel emulator signal chain. A Power Delay Profile (PDP), Autocorrelation/Doppler Spectrum, cross-polarization discrimination ratio (XPR) fading Cumulative and Probability Density Functions (CDF/PDF) on a per-radio link basis or output port basis, correlation matrix of the radio links, or a Signal-to-Noise Radio (SNR) on a per-radio link basis or output port basis can be calculated from the evaluated results of the calibration analysis signal processed by the channel emulator signal chain.

As indicated above, all the system features are not repeated here and should be considered repeated by reference.

Other implementations may include a non-transitory computer readable storage medium storing instructions executable by a processor to perform functions of the system described above. Yet another implementation may include a method performing the functions of the system described above.

In one implementation of the technology disclosed, the calibration chain is concentrated in a single location, while in another implementation, the calibration chain analog and digital components respectively reside at distant locations. In many implementations of the technology disclosed, the sequence generator of the calibration chain is an AWG that creates a specific modulated waveform in order to measure the EVM of the signal chain. In other implementations, the sequence generator of the calibration chain is an AWG that creates two specific tones separated by a specific frequency in order to measure intermodulation products. In yet other implementations, the sequence generator of the calibration chain is an AWG that creates a specific modulated waveform and controls the output impedance of the signal chain to find an optimum operating point of a final amplifier.

A method implementation of the technology disclosed includes creating a calibration signal that can traverse the CE signal chain to be calibrated, enabling observation and correction of parameter values for phase, amplitude, delay, and flatness. In one implementation, the calibration signal used for calibration is a MaxL sequence. In another implementation, the calibration signal used for calibration is a Gold code sequence. In yet another implementation, the calibration signal used for calibration is a CAZAC sequence, such as a Zadoff-Chu sequence.

Some implementations of the technology disclosed include the calibration chain being active at all times that the CE signal chain is active, while other implementations include the calibration chain only being active at certain stages of CE use. Many implementations include multiple parallel chains corresponding to a M×N MIMO system. In certain implementations, each respective input signal will be coupled to a corresponding MaxL sequence for calibration. In one implementation, all calibration chains rely on the same sequence, but an orthogonal Walsh code is used to maintain each signal on a single port orthogonal to one another. In one implementation, the calibration signal is continuously transmitted. In another implementation, the calibration signal is intermittently transmitted, either at regular periodic intervals or at random intervals. In yet another implementation, a user can choose when to invoke the calibration signal transmittal.

One method implementation further includes using a signal canceller in order to cancel the internally created calibration signal from the output in order to observe impairments introduced by the CE. In some implementations, observed impairments are logged for offline display. The impaired signal may also be broadcasted into an anechoic chamber by one or more probes to be picked up by a separate probe. Alternatively, the signal can be picked up by the same probes responsible for broadcasting the signal.

Each of the features discussed in this particular implementation section for the first system implementation apply equally to this method implementation. As indicated above, all the system features are not repeated here and should be considered repeated by reference.

Other implementations may include a non-transitory computer readable storage medium storing instructions executable by a processor to perform a method as described above. Yet another implementation may include a system including memory and one or more processors operable to execute instructions, stored in the memory, to perform a method as described above.

In many implementations of the technology disclosed, the CE further includes a plurality of integrated parallel calibration signal chains, wherein each respective integrated parallel calibration signal chain includes a different pseudo-random sequence. In one particular implementation, the CE further includes a plurality of integrated parallel calibration signal chains, wherein each integrated parallel calibration signal chain of the plurality of integrated parallel calibration signal chains includes the same pseudo-random sequence, and an orthogonal Walsh code is used to keep the pseudo-random sequences of the plurality of integrated parallel calibration signal chains, on a single port, orthogonal to one another.

In some implementations, the CE further includes an AWG configured to create a specific modulated waveform to measure the error vector magnitude of the CE signal chain, generate two tones separated by a give frequency to measure intermodulation of the CE signal chain, or generate a specific modulated waveform and control the output impedance, in order to find the optimum operating point of a final amplifier. In various implementations, the first and second signal conditioners of the CE perform one or more of an impedance matching, an attenuation, an amplification, or a filtering of one or more signals.

The technology disclosed can be practiced as a system, method, or article of manufacture. One or more features of an implementation can be combined with the base implementation. Implementations that are not mutually exclusive are taught to be combinable. One or more features of an implementation can be combined with other implementations.

While the technology disclosed is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the innovation and the scope of the following claims.

We claim as follows:

1. A channel emulator configured to perform self-calibration, the channel emulator including:
   at least one channel emulator signal chain, wherein the at least one channel emulator signal chain further includes:
      an input, coupled to a first signal conditioner, the first signal conditioner being coupled to a first analog-to-digital converter, the first analog-to-digital converter being coupled to a dynamically calibrated baseband processor, the dynamically calibrated baseband processor being coupled to a second signal conditioner, and the second signal conditioner being coupled to an output,
         wherein the dynamically calibrated baseband processor receives a clock signal from a master clock; and
   at least one integrated parallel calibration signal chain, wherein the integrated parallel calibration signal chain further includes:
      a sequence generator, including a signal modulator, and a comparator wherein:
         the sequence generator is configured to: (i) receive the clock signal from the master clock, (ii) generate a pseudo-random sequence, and (iii) produce a calibration analysis signal overlaying the pseudo-random sequence,
         on a supplying side, the sequence generator is coupled to a second digital-to-analog converter to supply the calibration analysis signal to be processed by the channel emulator signal chain, and
         on an evaluating side, the sequence generator is coupled to the comparator to evaluate results of the processed calibration analysis signal, received from the channel emulator signal chain.

2. The channel emulator of claim 1, further including the first signal conditioner being coupled to a first down converter, the first down converter being coupled to the first analog to digital converter.

3. The channel emulator of claim 2, further including the dynamically calibrated baseband processor being coupled to a first up converter, the first up converter being coupled to a second signal conditioner.

4. The channel emulator of claim 3, wherein, on the supplying side, the second digital-to-analog converter is coupled to a second up converter, which is coupled to the input to the channel emulator signal chain.

5. The channel emulator of claim 3, wherein, on the evaluating side, the output of the channel emulator signal chain is coupled to a second down converter, the second down converter being coupled to a second analog-to-digital converter, and the second analog-to-digital converter being coupled to the comparator.

6. The channel emulator of claim 1, wherein an output of the comparator is coupled to the dynamically calibrated baseband processor as a calibration analysis signal.

7. The channel emulator of claim 6, wherein a sequence generation logic of the sequence generator generates a wideband signal, a two-tone signal, or a single tone signal (i) for the processing by the channel emulator signal chain and (ii) for the use by the comparator in an evaluation of the results of the processed calibration analysis signal.

8. The channel emulator of claim 1, wherein an evaluation of the results of the processed calibration analysis signal further includes:
   selecting at least one signal component received from the output corresponding to a processed calibration analysis signal;
   delay and time matching a calibration analysis signal sent to the input of the channel emulator signal chain with the output corresponding to a processed calibration analysis signal;
   analyzing differences between a calibration analysis signal sent to the input of the channel emulator signal chain and the output corresponding to a processed calibration analysis signal; and
   processing the analyzed differences to derive adjustments in parameters used by the dynamically calibrated baseband processor, wherein the parameters include one or more of a delay parameter, an amplitude parameter, and a flatness parameter.

9. The channel emulator of claim 1, wherein the sequence generator is configured to generate, as an alternative to the pseudo-random sequence, a maximum length sequence, a Gold sequence, a generalized chirp-like sequence, or a Zadoff-Chu sequence.

10. The channel emulator of claim 1, further including a plurality of integrated parallel calibration signal chains, wherein each respective integrated parallel calibration signal chain includes a different pseudo-random sequence.

11. The channel emulator of claim 1, further including a plurality of integrated parallel calibration signal chains, wherein each integrated parallel calibration signal chain of the plurality of integrated parallel calibration signal chains includes the same pseudo-random sequence, and an orthogonal Walsh code is used to keep the pseudo-random sequences of the plurality of integrated parallel calibration signal chains, on a single port, orthogonal to one another.

12. The channel emulator of claim 1, further including an arbitrary waveform generator configured to:
   create a specific modulated waveform to measure an error vector magnitude of the channel emulator signal chain;
   generate two tones separated by a give frequency to measure intermodulation of the channel emulator signal chain; or
   generate a specific modulated waveform and control an output impedance, in order to find an optimum operating point of a final amplifier.

13. The channel emulator of claim 1, wherein the first and second signal conditioners perform one or more of an impedance matching, an attenuation, an amplification, or a filtering of one or more signals.

14. A method of self-calibrating a channel emulator, the method including:

the channel emulator, including a dynamically calibrated baseband processor, invoking at least one integrated calibration signal chain from a channel emulator signal chain, wherein the integrated calibration signal chain includes a sequence generator, and the sequence generator further includes a signal modulator;

the sequence generator generating a pseudo-random sequence and the signal modulator overlaying a calibration analysis signal on the pseudo-random sequence, wherein the calibration analysis signal is a wideband signal, a two-tone signal, or a single tone signal to be processed by the channel emulator signal chain; and the sequence generator supplying the calibration analysis signal to be processed by the channel emulator signal chain and supplying the calibration analysis signal to a comparator to evaluate results of the calibration analysis signal processed by the channel emulator signal chain.

15. The method of claim 14, wherein an evaluation of the results of the processed calibration analysis signal further includes:

selectively filtering at least one signal component from the output of the channel emulator signal chain, the selected signal component corresponding to a processed calibration analysis signal;

delay and time matching the calibration analysis signal sent out to the input of the channel emulator signal chain with the processed calibration analysis signal received from the output of the channel emulator signal chain; and analyzing differences between the calibration analysis signal and the processed calibration analysis signal received, and deriving, from the analysis, adjustments in delay, amplitude, phase, and flatness parameters.

16. The method of claim 15, further including the comparator passing the derived adjustments to the dynamically calibrated baseband processor.

17. The method of claim 15, further including the comparator storing the derived adjustments in a memory for future use.

18. The method of claim 15, further including the comparator detecting an out-of-range value for the delay, amplitude, phase, and flatness parameters and reporting the detected out-of-range value to a user.

19. A non-transitory computer readable storage medium impressed with computer program instructions for channel emulator self-calibration, the instructions, when executed on a processor, causing the processor to implement a method comprising:

the channel emulator, including a dynamically calibrated baseband processor, invoking at least one integrated calibration signal chain from a channel emulator signal chain, wherein the integrated calibration signal chain includes a sequence generator, and the sequence generator further includes a signal modulator;

the sequence generator generating a pseudo-random sequence and the signal modulator overlaying a calibration analysis signal on the pseudo-random sequence, wherein the calibration analysis signal is a wideband signal, a two-tone signal, or a single tone signal to be processed by the channel emulator signal chain; and the sequence generator supplying the calibration analysis signal to be processed by the channel emulator signal chain and supplying the calibration analysis signal to a comparator to evaluate results of the calibration analysis signal processed by the channel emulator signal chain.

20. The non-transitory computer readable storage medium of claim 19, further including:

a signal canceller receiving the evaluated results of the calibration analysis signal processed by the channel emulator signal chain; and calculating, from the evaluated results of the calibration analysis signal processed by the channel emulator signal chain, a Power Delay Profile (PDP), Autocorrelation/Doppler Spectrum, cross-polarization discrimination ratio (XPR) fading Cumulative and Probability Density Functions (CDF/PDF) on a per-radio link basis or output port basis, correlation matrix of the radio links, or a Signal-to-Noise Radio (SNR) on a per-radio link basis or output port basis.

* * * * *